(12) United States Patent
Kawachi et al.

(10) Patent No.: US 6,388,545 B1
(45) Date of Patent: *May 14, 2002

(54) SURFACE-ACOUSTIC-WAVE FILTER HAVING AN IMPROVED SUPPRESSION OUTSIDE A PASS-BAND

(75) Inventors: Osamu Kawachi; Masanori Ueda; Akira Suga, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/317,618

(22) Filed: May 25, 1999

(30) Foreign Application Priority Data

May 29, 1998 (JP) .............................. 10-150100

(51) Int. Cl.⁷ .............................. H03H 9/64; H03H 9/72
(52) U.S. Cl. ........................ 333/193; 333/195; 333/133; 310/313 B
(58) Field of Search .................. 333/193–196, 333/133; 310/313 R, 313 B, 313 C, 313 D

(56) References Cited

U.S. PATENT DOCUMENTS

| | | | | |
|---|---|---|---|---|
| 4,365,219 A | * | 12/1982 | Nathan | 333/193 |
| 4,409,567 A | | 10/1983 | Setsune et al. | 333/151 |
| 5,561,406 A | * | 10/1996 | Ikata et al. | 333/126 |
| 5,914,646 A | * | 6/1999 | Hashimoto | 333/195 |
| 6,037,698 A | * | 3/2000 | Ueda et al. | 310/313 R |
| 6,078,229 A | * | 6/2000 | Funada et al. | 333/193 |
| 6,150,904 A | * | 11/2000 | Taniguchi et al. | 333/193 |

FOREIGN PATENT DOCUMENTS

| | | | | |
|---|---|---|---|---|
| EP | 0 637 871 | 2/1995 | | |
| EP | 0 798 853 | 10/1997 | | |
| EP | 0 829 958 | 3/1998 | | |
| EP | 0 836 278 | 4/1998 | | |
| EP | 0 853 381 | 7/1998 | | |
| JP | 4-263509 | * | 9/1992 | 333/193 |
| JP | 5-275965 | * | 10/1993 | |
| JP | 7-264000 | | 10/1995 | |
| JP | 9-116377 | | 5/1997 | |
| JP | 9-186550 | | 7/1997 | |
| JP | 9-232904 | | 9/1997 | |
| JP | 9-232910 | | 9/1997 | |

OTHER PUBLICATIONS

International Publication No. WO98/00914, published Jan. 8, 1998.

* cited by examiner

Primary Examiner—Benny Lee
Assistant Examiner—Barbara Summons
(74) Attorney, Agent, or Firm—Arent Fox Kintner Plotkin & Kahn, PLLC

(57) ABSTRACT

A SAW-filter device includes a piezoelectric substrate carrying thereon a first interdigital electrode pair connected to an input terminal and a second interdigital electrode pair connected to an output terminal. The first interdigital electrode pair is grounded to a first ground pad, while the second interdigital electrode pair is grounded to a second ground pad different from the first ground pad. The piezoelectric substrate is accommodated into a space formed in a package body, wherein the space is covered by a metal cap member connected to one of the first and second ground pads.

28 Claims, 33 Drawing Sheets

FIG.4
PRIOR ART
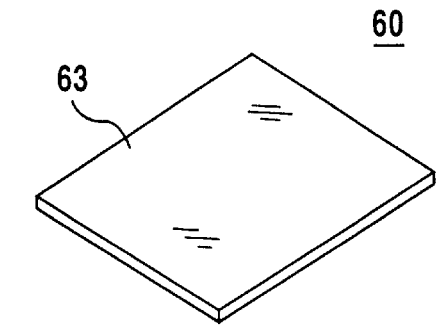
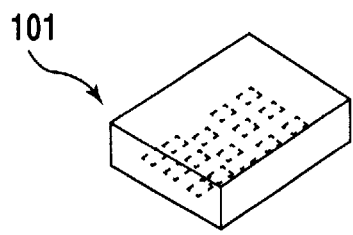
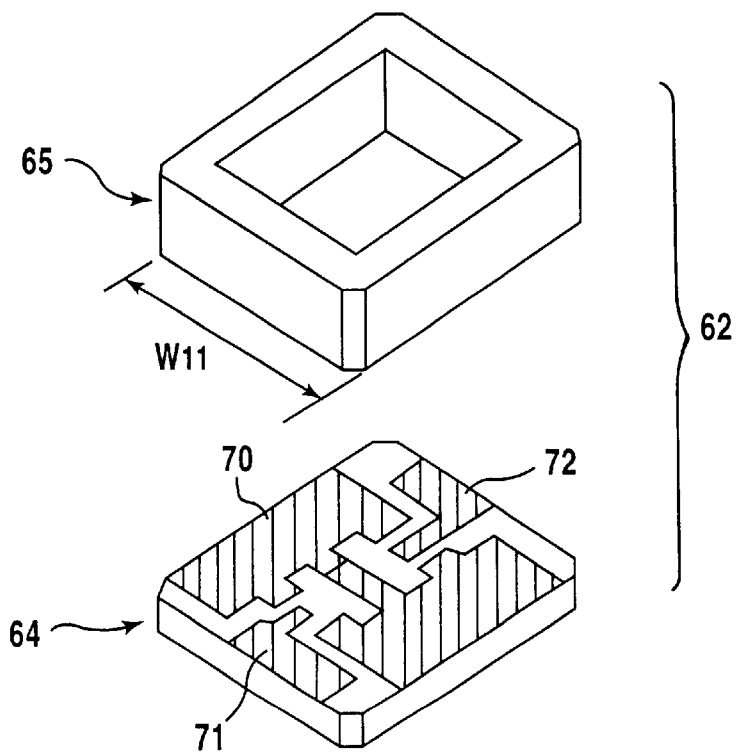

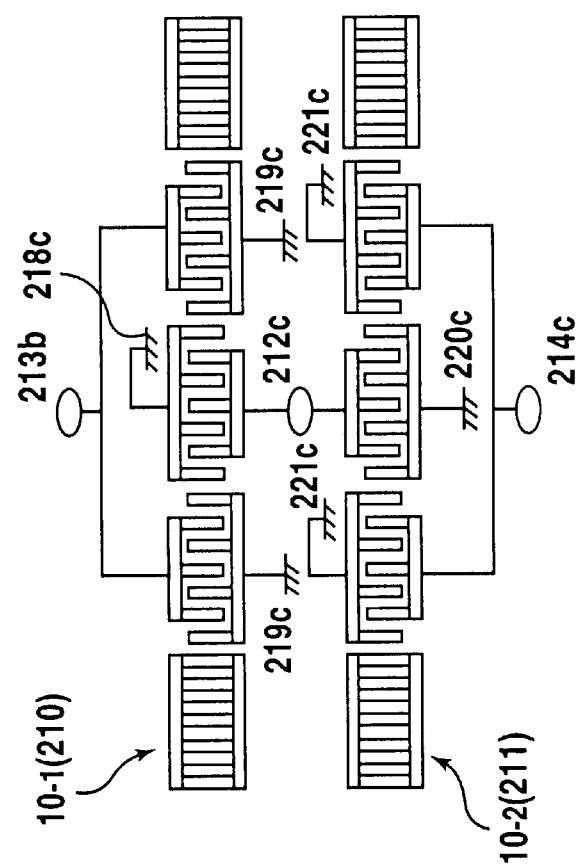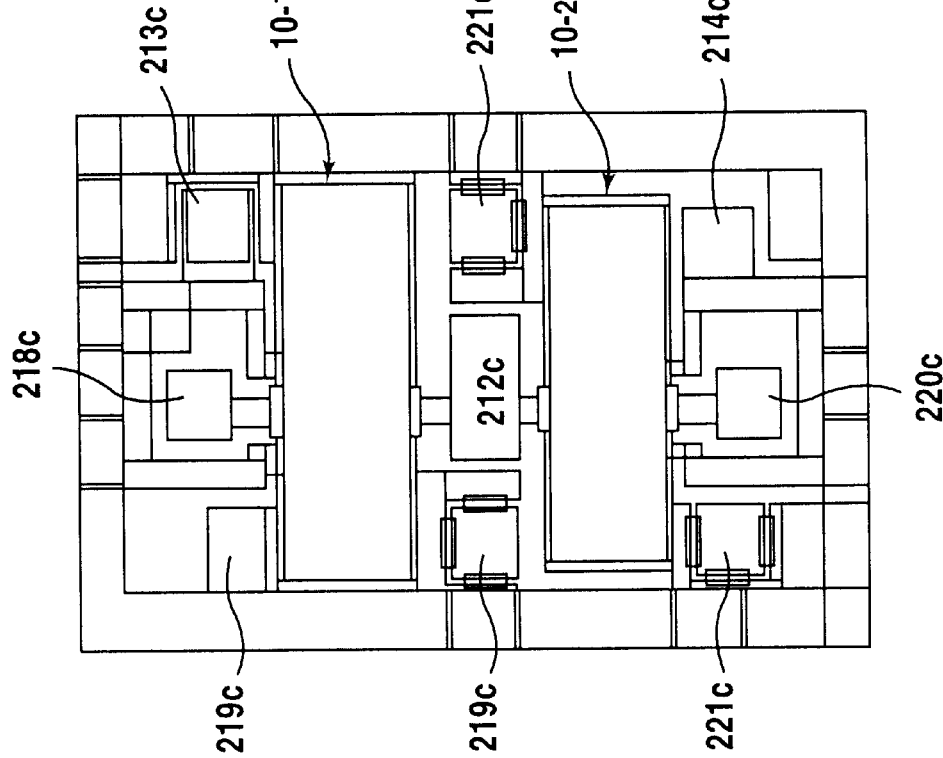
FIG. 28A
FIG. 28B

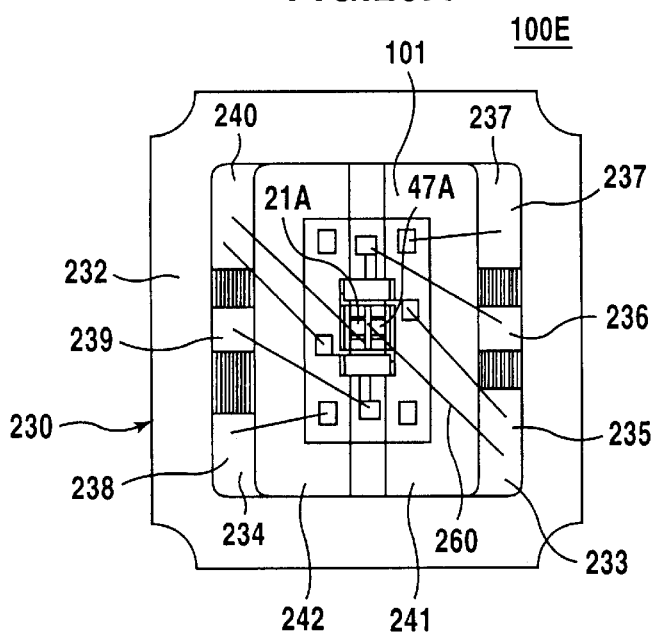
FIG.29A
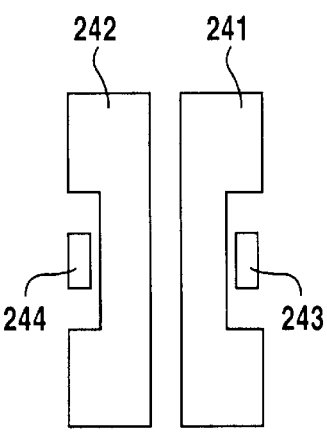
FIG.29C
FIG.29B
FIG.29D
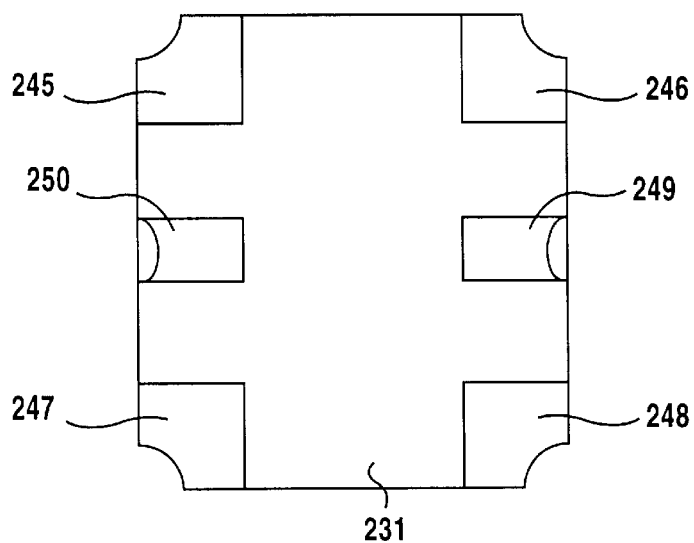

SURFACE-ACOUSTIC-WAVE FILTER HAVING AN IMPROVED SUPPRESSION OUTSIDE A PASS-BAND

BACKGROUND OF THE INVENTION

The present invention generally relates to SAW (surface-acoustic-wave) filter devices and more particularly to a SAW-filter device for use in ultra-high frequency applications including the RF unit of portable telephone apparatuses.

SAW-filter devices are used extensively in the RF unit of portable telephone apparatuses as a filter element. A SAW filter device achieves the desired filtering of ultra-high frequency signals by using a SAW excited on a piezoelectric substrate by piezoelectric effect. In the application of a SAW-filter in portable telephone apparatuses, it is required that the SAW-filter device provides a pass-band of about 900 MHz and a sharp attenuation outside the pass-band. Further, it is required that the SAW-filter device is capable of effectively suppressing the spurious frequency components having a much higher frequency, in the order of several GHz. In the RF unit of portable telephone apparatuses, in which a number of SAW-filter devices having respective, different pass-bands are used in various parts such as antenna duplexer, inter-stage filter circuit, IF filter circuit, and the like, there is a case that a spurious component having such a GHz-band frequency is formed as a result of the interference of the SAW-filter devices. Thus, in order to ensure a proper operation of the portable telephone apparatus, it is necessary to suppress such a GHz-band spurious components by way of a SAW-filter device.

Generally, a SAW-filter device includes a SAW-filter body carrying various reflectors and interdigital electrodes on a piezoelectric substrate in such a state that the SAW-filter body is accommodated in a package body. Thereby, the SAW-filter device thus accommodating therein the SAW-filter body is mounted on a printed circuit board by soldering the soldering pads formed on the package body.

Hereinafter, the reflectors and interdigital electrodes formed on the piezoelectric substrate will be explained briefly.

FIG. 1A shows the construction of a double-mode, single-type SAW-filter 10.

Referring to FIG.1A, the SAW-filter 10 includes an input interdigital electrode pair 11 disposed at a center and output interdigital electrode pairs 12 and 13 are disposed at both lateral sides of the central interdigital electrode pair 11. Further, reflectors 14 and 15 are disposed at further outer sides of the output interdigital electrode pairs 12 and 13, respectively.

The input interdigital electrode pair 11 is formed of a primary side electrode $11_{-1}$ connected to an input terminal 20 and a secondary side electrode $11_{-2}$ connected to a ground 21, while the output interdigital electrode pair 12 includes a primary side electrode $12_{-1}$ connected to an output terminal 22 and a secondary side electrode $12_{-2}$ connected to a ground 23. Further, the output interdigital electrode pair 13 includes a primary side electrode $13_{-1}$ connected to the foregoing output terminal 22 commonly to the electrode $12_{-1}$ and a secondary side electrode $13_{-2}$ connected to a ground 24.

The SAW-filter 10 thus formed in a double-mode filter as noted before and uses a first-order mode having a frequency $f_1$ and a second-order mode having a frequency $f_3$ both formed between the reflectors 14A and 15B as represented in FIG. 1B. Thereby, a frequency characteristic having a pass-band between the frequency $f_1$ and the frequency $f_3$ is obtained as represented in FIG. 2. It should be noted that FIG. 1B represents the distribution of the SAW energy in the structure of FIG. 1A.

FIG. 3 shows the construction of a double-mode SAW-filter 40 in which two SAW-filters 10 each having the construction of FIG. 1A are cascaded with each other. In the explanation below, those parts corresponding to the parts described already with reference to FIG. 1A are designated by the same reference numerals and the description thereof will be omitted.

Referring to FIG. 3, it can be seen that two SAW-filter elements $10_{-1}$ and $10_{-2}$, each having a construction similar to that of the SAW-filter 10 of FIG. 1A, are cascaded in series in the SAW-filter 40, wherein the SAW-filter element $10_{-1}$ is a single type SAW-filter element and includes a central input electrode pair corresponding to the input electrode pair 11 of FIG. 1A and thus designated by the same reference numeral 11. In the construction of FIG. 3, the input electrode pair 11 is surrounded laterally by a pair of output electrode pairs corresponding to the output electrode pairs 12 and 13 of FIG. 1A and thus designated by the reference numerals 12 and 13. Further, reflectors corresponding to the reflectors 14 and 15 of FIG. 1A and designated by the same reference numerals of 14 and 15 are disposed at further outer sides of the output electrode pairs 12 and 13. In the SAW-filter element $10_{-1}$, the primary side interdigital electrode $11_{-1}$ of the central input electrode pair 11 is connected to the input terminal 20.

On the other hand, the SAW-filter element $10_{-2}$ is a single type SAW-filter element similar to the SAW-filter element $10_{-1}$ and includes a central output electrode pair 41 surrounded laterally by a pair of input electrode pairs 42 and 43, and a pair of reflectors 44 and 45 are disposed at further outer sides of the input electrode pairs 42 and 43. The central output electrode pair 41 includes a primary side interdigital electrode $41_{-1}$ and a secondary side interdigital electrode $41_{-2}$, wherein the primary side interdigital electrode $41_{-1}$ is connected to an output terminal 46 and the secondary side interdigital electrode $41_{-2}$ is connected to a ground 47. Further, the input electrode pair 42 includes a primary side interdigital electrode $42_{-1}$ connected to the primary side interdigital electrode $12_{-1}$ of the output electrode pair 12 constituting the SAW-filter unit 10 and a secondary side interdigital electrode $42_{-2}$ connected to a ground 48. Similarly, the input electrode pair 43 includes a primary side interdigital electrode $43_{-1}$ connected to the primary side interdigital electrode $13_{-1}$ of the output electrode pair 13 constituting the SAW-filter unit 10 and a secondary side interdigital electrode $43_{-2}$ connected to a ground 49.

The SAW-filter 40 of FIG. 3 has a frequency characteristic improved over the frequency characteristic of the SAW-filter 10 of FIG. 1.

FIG. 4, FIGS. 5A–5C, FIG. 6 and FIG. 7 show the construction of another conventional SAW-filter package device 60, wherein FIG. 4 shows the SAW-filter package device 60 in an exploded state while FIGS. 5A–5C show the SAW-filter respectively in a top plan view, a side view and a bottom plan view. Further, FIG. 6 shows the SAW-filter package device 60 in a cross-sectional view taken along a line VI—VI of FIG. 5A, while FIG. 7 shows the electrical interconnection formed in the SAW-filter package device 60.

Referring to the drawings, the SAW-filter package device 60 includes a rectangular package body 62 accommodating therein a SAW-filter body 101 to be described with reference to FIG. 12 and a cap 63 sealing the package body 62. The SAW-filter body 101 carries thereon ground terminals 21A, 23A, 47A and 48A as represented in FIG. 12.

The package body 62, in turn, includes a bottom plate 64 and a rectangular frame member 65 holding therein the bottom plate 64, wherein the bottom plate 64 carries, on a top surface thereof, a ground pad 70, an input pad 71 and an output pad 72 as represented also in FIG. 7. Further, the bottom plate 64 carries, on a bottom surface thereof, a pair of ground foot patterns 73 and 74 so as to face each other diagonally on a first diagonal line, wherein the bottom plate 64 further carries, on the bottom surface thereof, an input foot pattern 75 and an output foot pattern 76 so as to face each other diagonally on a second diagonal line. The ground foot pattern 73 is thereby connected to the ground pad 70 by a via-hole 77, while the ground foot pattern 74 is connected to the ground pad 70 by a via-hole 78. Further, the input pad 71 is connected to the input foot pattern 75 by a via-hole 79, and the output pad 72 is connected to the output foot pattern 76 by a via-hole 80. The ground pad 70 has a generally H-shaped form and forms an electrically unitary body in which each point in the ground pad 70 is electrically connected to an arbitrary point included in the ground pad 70. It should be noted that the SAW-filter body 101 is thereby mounted on the bottom plate 64 in such a state that the interconnection terminals of the SAW-filter body 101 are connected to corresponding electrode pads 70, 71 and 72.

It should be noted that, in the SAW-filter package device 60, the entire ground terminals 21A, 23A, 47A and 48A (see FIG. 12) are connected to the ground pad 70 commonly. In the example of the device 10 of FIG. 1A, the grounds 23, 24 and 21 are connected with each other to the ground pad 70.

The ground pad 70, in turn, is connected to the cap 63 by way of via-holes 81 and 82 formed in the frame member 65.

The SAW-filter package device 60, in turn, is mounted on a printed circuit board by soldering the ground foot patterns 73 and 74, the input foot pattern 75 and the output foot pattern 76 to respective, corresponding pads formed on the printed circuit board.

FIG. 13 shows the frequency characteristic of various SAW-filters including the SAW-filter package device 60 in the state that the SAW-filters are mounted on a printed circuit board in an enlarged scale including the pass-band frequency of 950 MHz, wherein the curve Ia of FIG. 13 represents the result of the measurement for the SAW-filter package device 60 thus mounted on the printed circuit board. Further, the FIG. 14 shows the frequency characteristic of the SAW-filters over a wider frequency range, wherein the curve IIa of FIG. 14 shows the frequency characteristic for the SAW-filter package device 60 mounted on the printed circuit board.

Referring to FIG. 13, it will be noted from the curve Ia that the magnitude of suppression or attenuation of the frequency components outside the SAW-filter pass-band is in the order of −50 dB, while it is desired, particularly in relation to the applications to portable telephones, that this magnitude of suppression is increased further.

Further, the curve IIa of FIG. 14 indicates that the magnitude of suppression in the frequency range of 2–3 GHz is in the order of −30 dB, while this magnitude of suppression not satisfactory for the applications to portable telephones.

The reason of this unsatisfactory attenuation of the SAW-filter package device 60 is attributed to the construction of the SAW-filter package device 60 that uses a common ground for the SAW-filter body 101. In such a construction, there may occur an interference between the impedance of the SAW-filter body 101 and the impedance of the package body 62 on the SAW-filter package device 60. More specifically, there may be a very small, but nevertheless non-infinitesimal, potential difference for the ground level between the input interdigital electrode pair and the output interdigital electrode pair, and that the interference between these two different ground levels may reduce the foregoing magnitude of attenuation outside the pass-band.

SUMMARY OF THE INVENTION

Accordingly, it is a general object of the present invention to provide a novel and useful SAW-filter wherein the foregoing problems are eliminated.

Another and more specific object of the present invention is to provide a SAW-filter device, comprising:

a piezoelectric substrate;

a SAW-filter circuit formed on said piezoelectric substrate, said SAW-filter circuit including a plurality of interdigital electrode pairs provided on said piezoelectric substrate;

a package body including therein a space, said package body accommodating said piezoelectric substrate in said space together with said SAW circuit, said package body carrying an input pad and an output pad, said package body further carrying a plurality of ground pads separated from said first ground pad, said plurality of ground pads including a first ground pad and a second ground pad; and a conductor cap member provided on said package body so as to close said space, said cap member being electrically connected to one of said first and second ground pads.

Another object of the present invention is to provide a SAW-filter device, comprising:

a piezoelectric substrate;

a SAW-filter circuit formed on said piezoelectric substrate, said SAW-filter circuit including a plurality of interdigital electrode pairs;

a package body including therein a space, said package body accommodating said piezoelectric substrate in said space, said package body carrying an input pad and an output pad, said package body further carrying a first ground pad and a second ground pad separated from said first ground pad; and a conductor cap member provided on said package body so as to close said space, said cap member being electrically connected to each of said first and second ground pads via first and second resistances.

Another object of the present invention is to provide a SAW-filter device, comprising:

a piezoelectric substrate;

a SAW-filter circuit formed on said piezoelectric substrate, said SAW-filter circuit including a plurality of interdigital electrode pairs;

a package body including therein a space, said package body accommodating said piezoelectric substrate in said space, said package body carrying an input pad and an output pad, said package body further carrying a first ground pad and a second ground pad separated from said first ground pad; and a conductor cap member provided on said package body so as to close said space, said first and second ground pads being electrically connected to each other via a resistance.

According to the present invention, the problem of fluctuation of the ground level occurring in the second interdigital electrode and in the fourth interdigital electrode is effectively eliminated by grounding the second interdigital electrode and the fourth interdigital electrode separately to the first ground pad and to the second ground pad on the package body. Thereby, the suppression of the frequency components outside the pass-band is improved substantially. When the second interdigital electrode and the fourth interdigital electrode are connected to a common ground pattern, it seems that there occurs an interference between the second and fourth interdigital electrodes via the common ground pattern. In the present invention, the first and second ground pads may be connected electrically by a resistance.

In the present invention, the suppression of the frequency components outside the pass-band is improved further by grounding the conductor cap member to one of the first and second grounding pads. By doing so, the effect of electromagnetic shielding of the SAW-filter body accommodated inside the package body is improved and the interference from external circuit devices is minimized. In a preferred embodiment of the present invention, the conductor cap member is connected to both the first and second ground pads of the package body via respective resistances.

Other objects and further features of the present invention will become apparent from the following detailed description when read in conjunction with the attach drawings.

BRIEF DESCRIPTION OF THE DRAWINGS

FIG. 4 is a diagram showing the construction of a conventional SAW-filter package device in an exploded state;

FIGS. 28A and 28B are diagrams showing the construction of a SAW-filter body used in the SAW-filter package device of the fifth embodiment;

FIGS. 29A–29D are diagrams showing the construction of a SAW-filter package device according to a sixth embodiment of the present invention;

DETAILED DESCRIPTION OF THE PREFERRED EMBODIMENTS

FIRST EMBODIMENT

Figure 8:
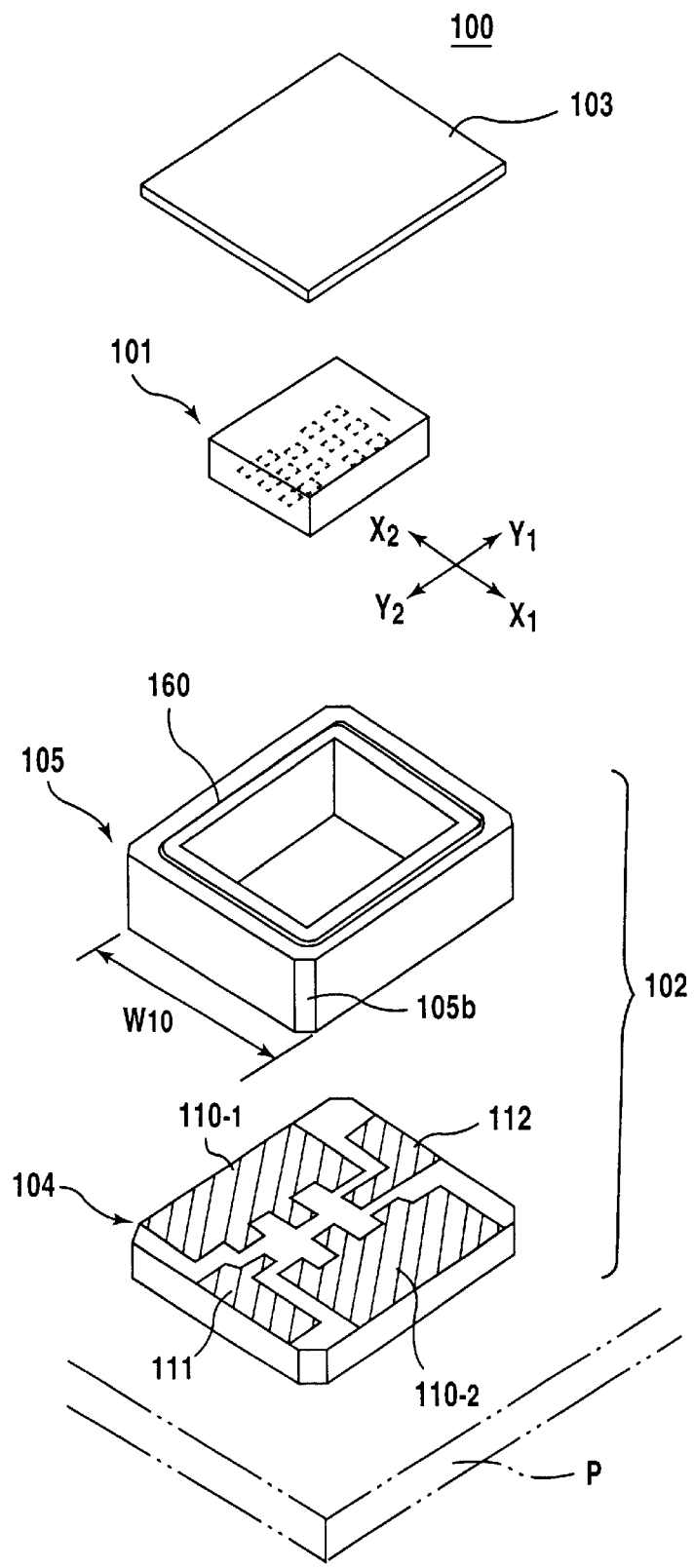
FIG. 8 is a diagram showing the construction of a SAW-filter package device according to a first embodiment of the present invention.
Figure 9C:
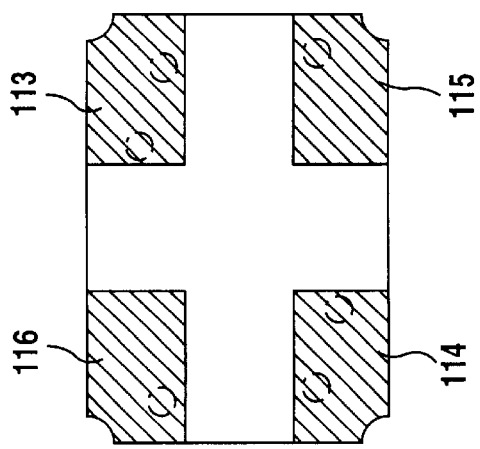
FIGS. 9A–9C are diagrams showing the SAW-filter package device of FIG. 8 respectively in a to plan view, a side view and a bottom view.
Figure 9B:
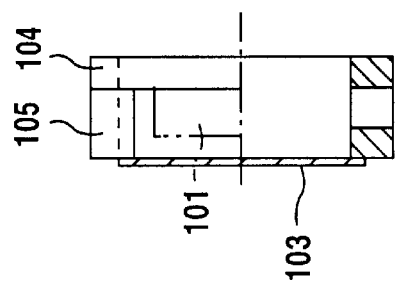
Figure 9A:
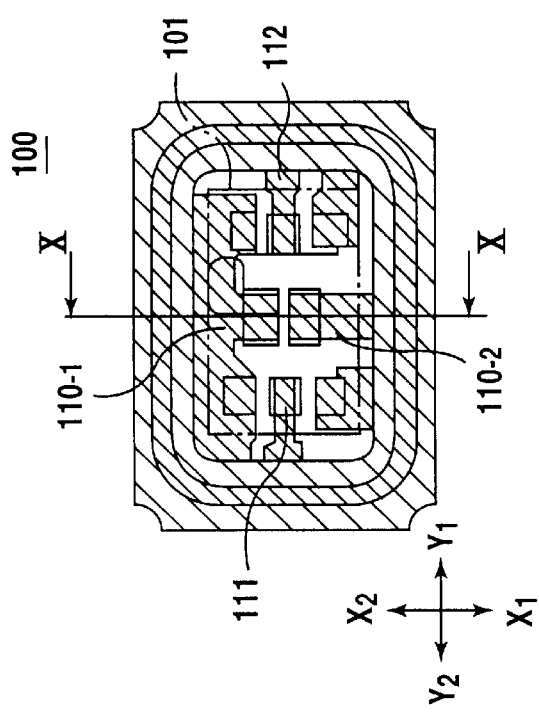
Figure 10:
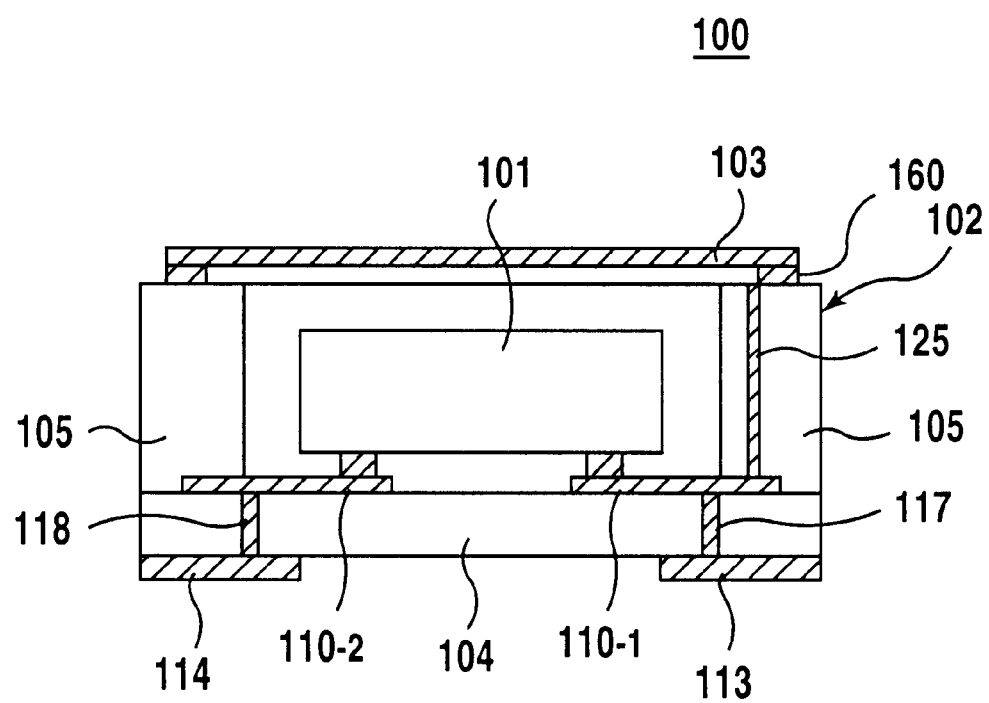
FIG. 10 is a diagram showing the construction of the SAW-filter package device of FIG. 8 in a cross-sectional view.
Figure 11:
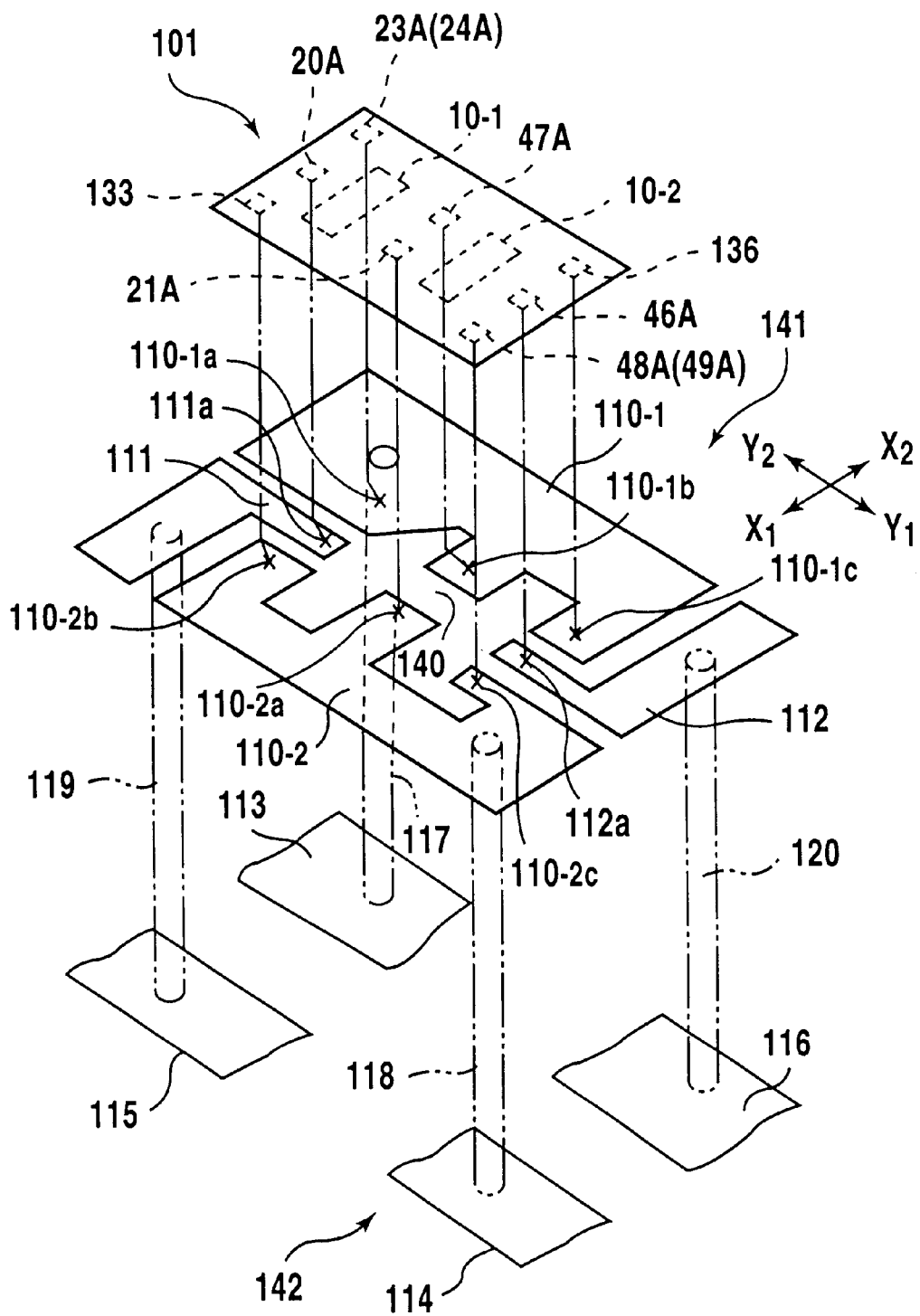
FIG. 11 is a diagram showing the electrical interconnection system used in the SAW-filter package device of FIG. 8.

FIG. 8, FIGS. 9A–9C, FIG. 10 and FIG. 11 show the construction of a SAW-filter package device 100 according to a first embodiment of the present invention, wherein FIG. 8 shows the SAW-filter package device 100 in an exploded state while FIGS. 9A–9C show the SAW-filter package device 100 respectively in a top plan view, a side view and a bottom plan view. Further, FIG. 10 shows the SAW-filter package device 100 in a cross-sectional view taken along a line X—X of FIG. 9A, while FIG. 11 shows the electrical interconnection formed in the SAW-filter package device 100.

Figure 12:
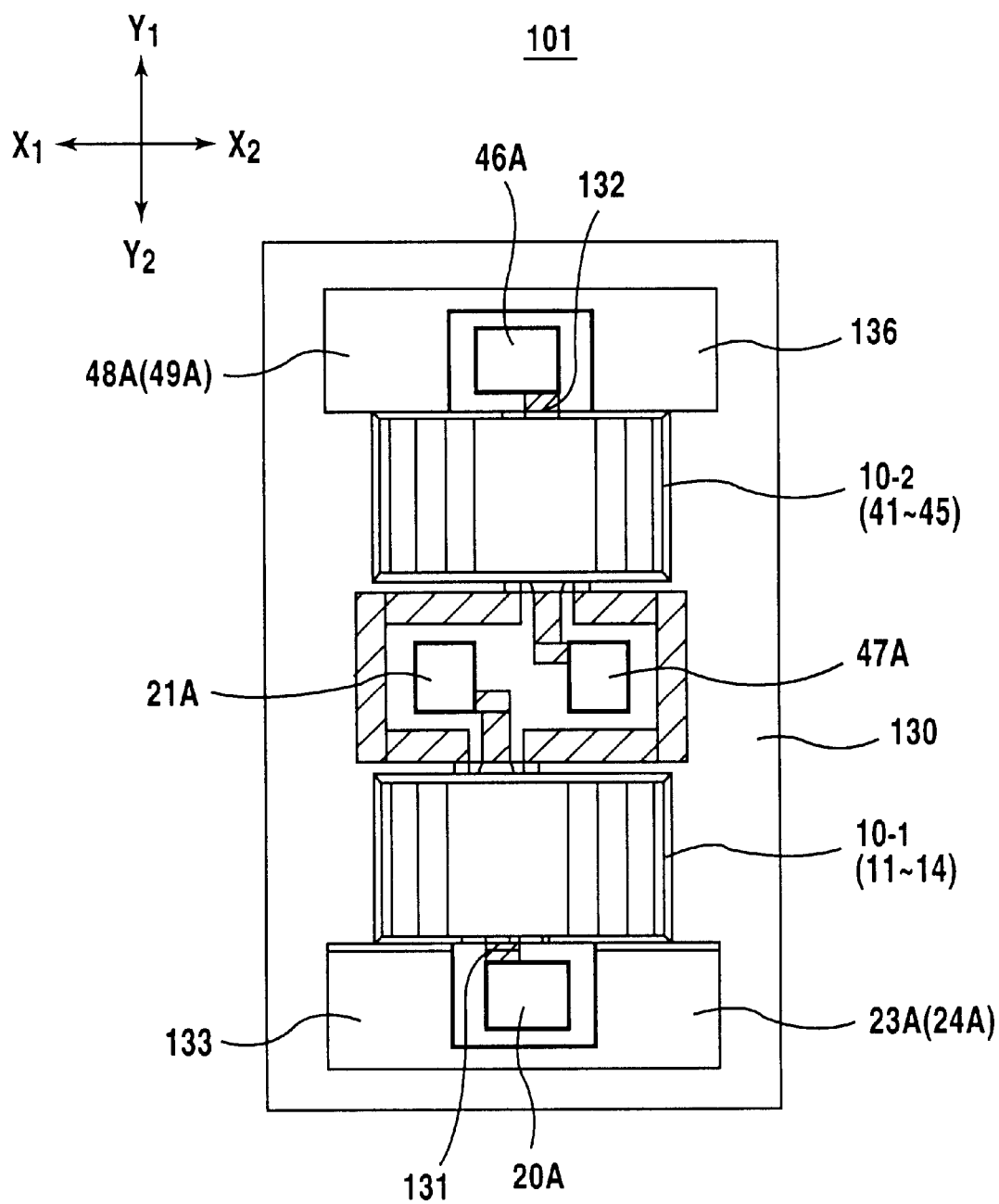
FIG. 12 is a diagram showing the construction of a SAW-filter body used in the SAW-filter package device of FIG. 8 in a bottom view.

Referring to the drawings, the SAW-filter package device 100 includes a rectangular package body 102 accommodating therein the SAW-filter body 101 shown in FIG. 12 and a conductor cap member 103 sealing the package body 102 similarly to the conventional SAW-filter package device 60. The SAW-filter body 101 carries thereon the ground terminals 21A, 23A, 47A and 48A as represented in FIG. 12.

The package body 102, in turn, includes a bottom plate 104 and a rectangular frame member 105 holding the bottom plate 104 thereon, wherein the bottom plate 104 carries, on a top surface thereof, ground pads $110_{-1}$ and $110_{-2}$, an input pad 111 and an output pad 112 as represented also in FIGS. 10 and 11. Further, the bottom plate 104 carries, on a bottom surface thereof, a pair of ground foot patterns 113 and 114 so as to face each other diagonally on a first diagonal line, wherein the bottom plate 104 further carries, on the bottom surface thereof, an input foot pattern 115 and an output foot pattern 116 so as to face each other diagonally on a second diagonal line. The ground foot pattern 113 is thereby connected to the ground pad $110_{-1}$ by a via-hole 117, while the ground foot pattern 114 is connected to the ground pad $110_{-2}$ by a via-hole 118. Further, the input pad 111 is connected to the input foot pattern 115 by a via-hole 119, and the output pad 112 is connected to the output foot pattern 116 by a via-hole 120.

In the present embodiment, the ground pad $110_{-1}$ and the ground pad $110_{-2}$ are separated from each other on the bottom, and the SAW-filter body 101 is mounted on the bottom plate 104 in such a state that the interconnection terminals of the SAW-filter body 101 are connected to corresponding electrode pads $110_{-1}$, $110_{-2}$, 111 and 112.

As represented in the cross-sectional view of FIG. 10, the frame member 105 includes therein a via-hole 125 for interconnecting the ground pad $110_{-1}$ to the conductor cap 103. On the other hand, the ground pad $110_{-2}$ is not connected to the cap 103.

Figures 1A, 1B:
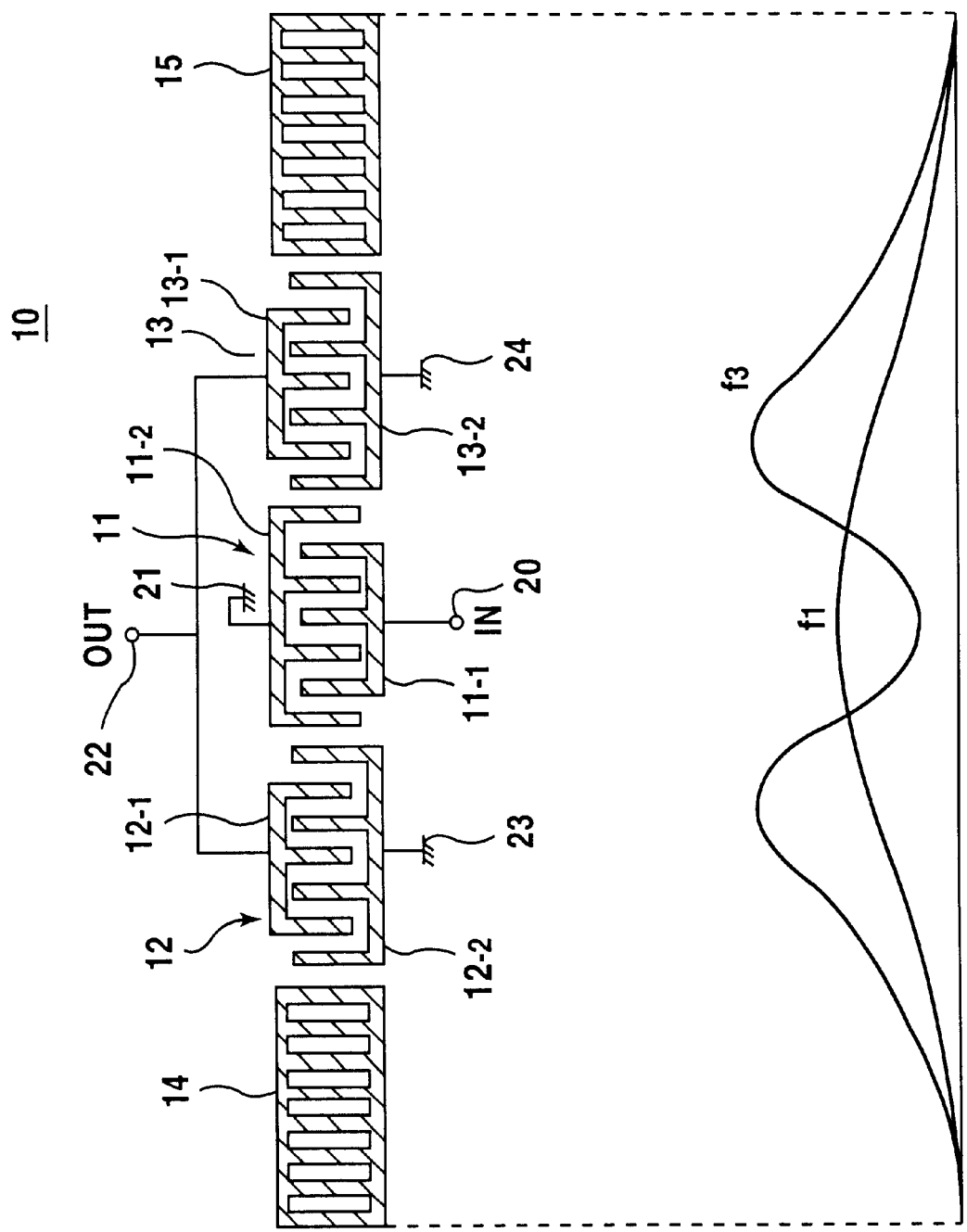
FIGS. 1A and 1B are diagrams showing the principle of a conventional double-mode, single-type SAW-filter.
Figure 2:
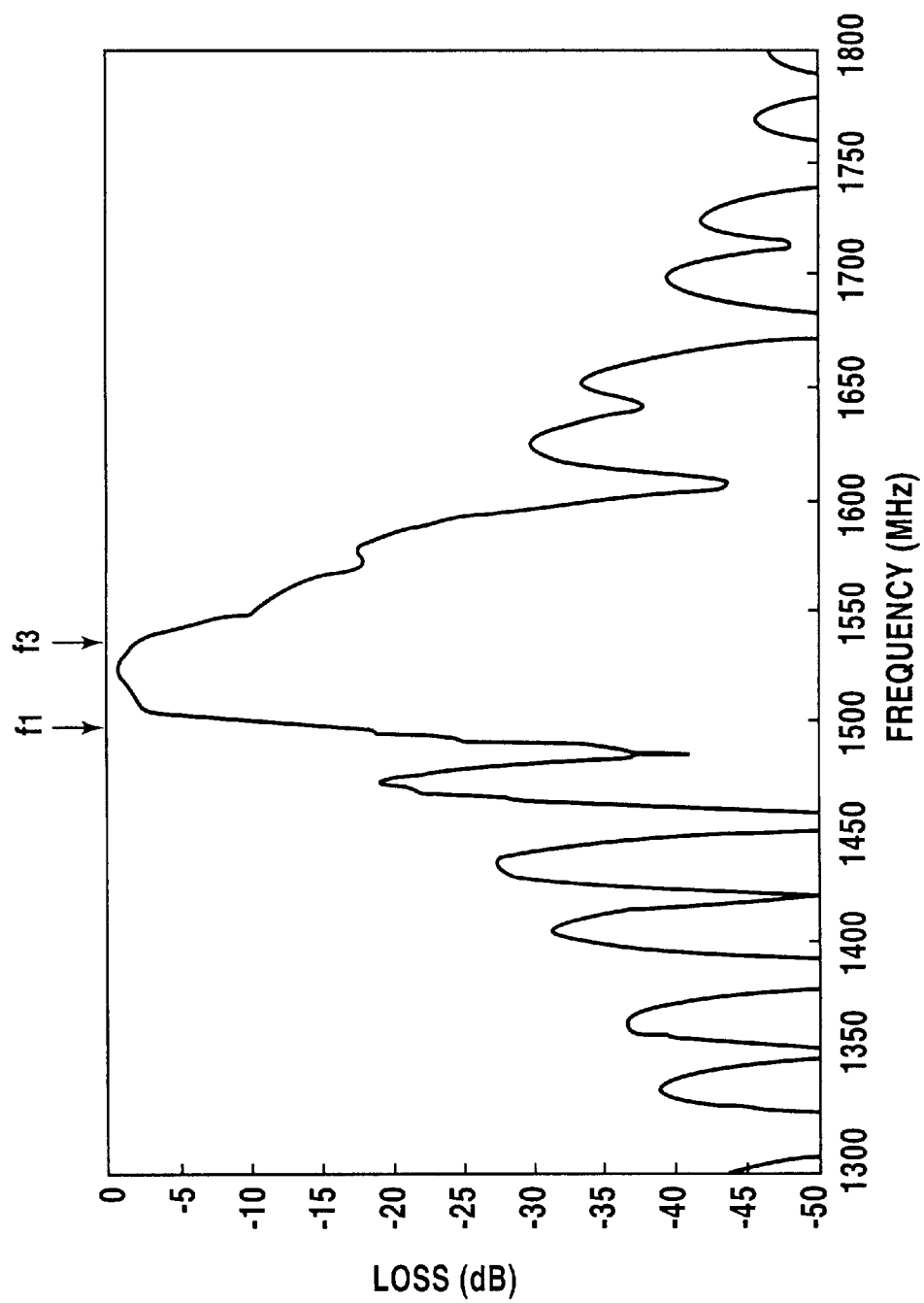
FIG. 2 is a diagram showing the frequency characteristic of the SAW-filter of FIGS. 1A and 1B.

FIG. 12 shows the construction of the SAW-filter body 101 in a bottom plan view, wherein those terminals corresponding to the terminals represented in FIG. 1A are designated with the same reference numerals attached with a suffix "A."

Figure 3:
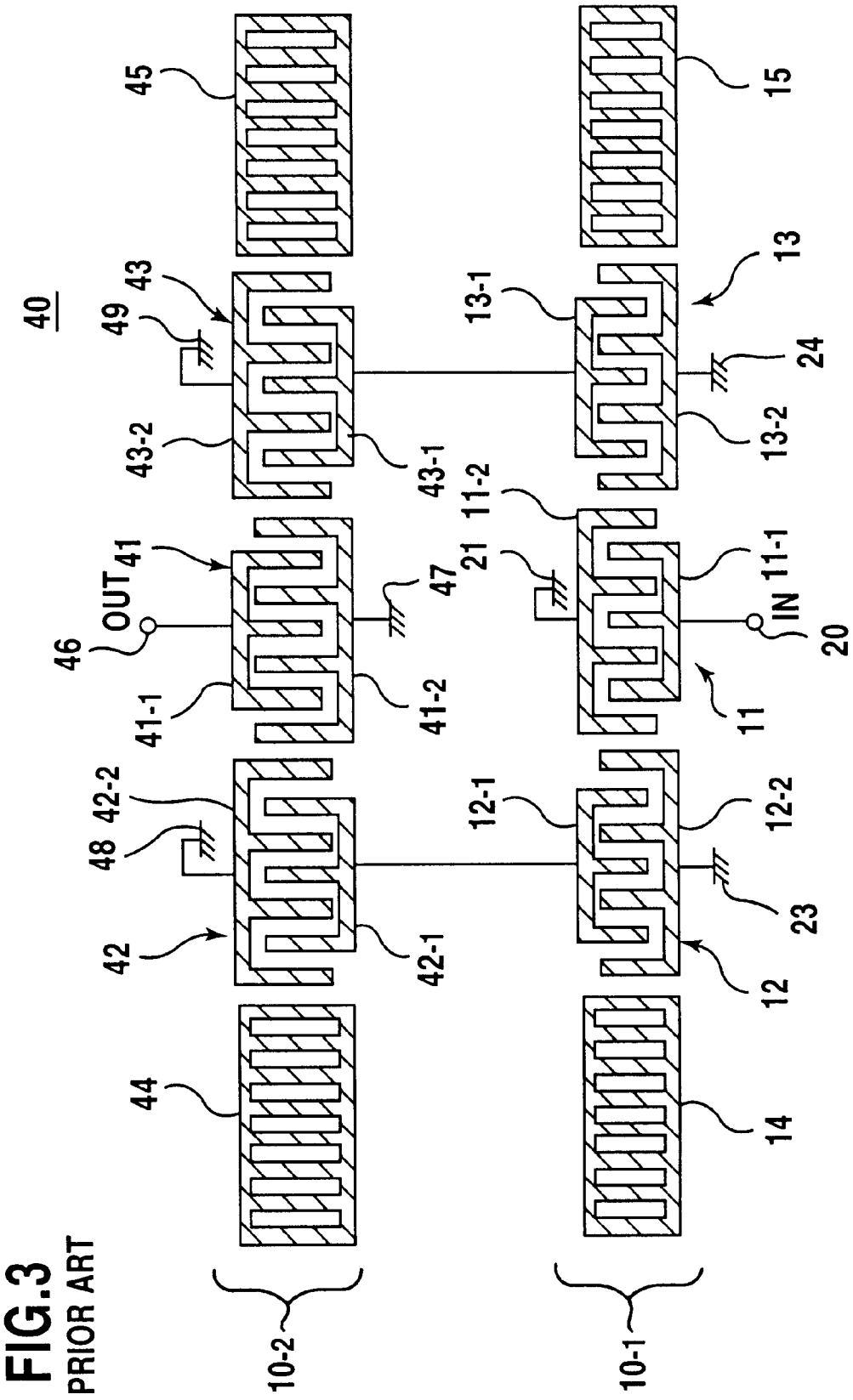
FIG. 3 is a diagram showing the principle of a conventional double-mode, cascaded-type SAW-filter.
Figure 5:
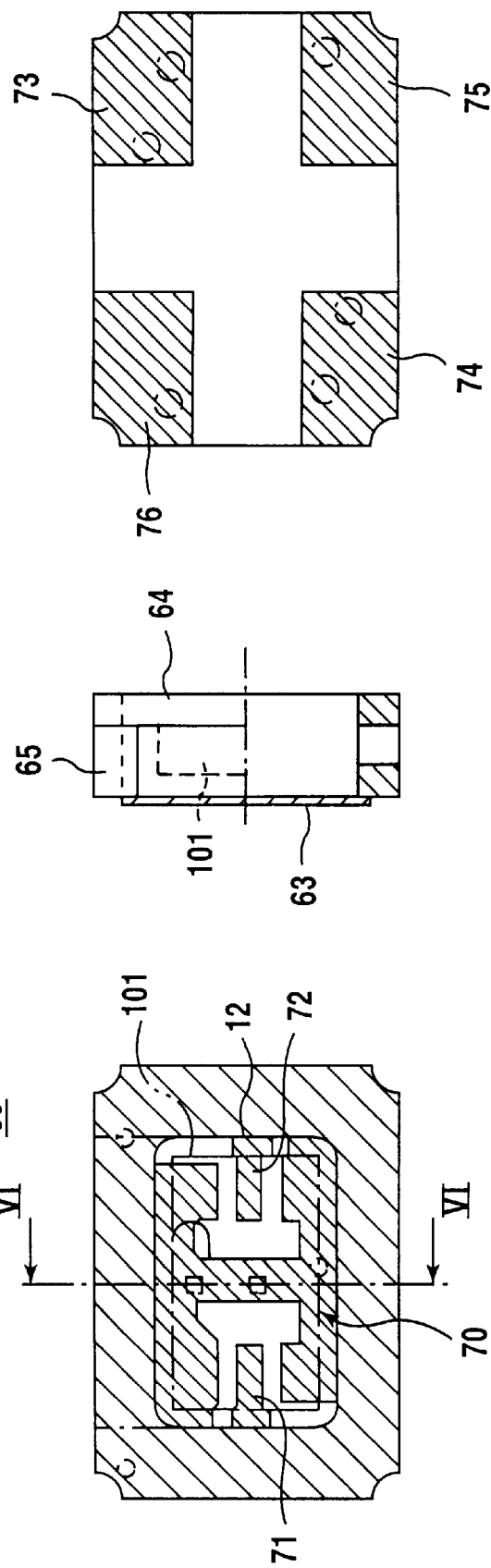
FIGS. 5A–5C are diagrams showing the SAW-filter package device of FIG. 4 respectively in a to plan view, a side view and a bottom view.

Referring to FIG. 12, the SAW-filter body 101 includes a piezoelectric substrate 130 carrying, on a bottom surface thereof, a SAW electrode structure corresponding to the SAW electrode 40 of FIG. 3, wherein the SAW electrode structure thus formed is a double mode type device and includes a cascaded connection of the SAW-filters $10_{-1}$ and $10_{-2}$.

As represented in FIG. 12, the bottom surface of the piezoelectric substrate 130 carries thereon an input terminal 20A, an output terminal 22A, a ground terminal 21A for the input-side interdigital electrode pair 11 constituting the first stage SAW-filter $10_{-1}$, a ground terminal 47A for the output interdigital electrode pair 41 constituting the second stage SAW-filter $10_{-2}$, a ground terminal for the grounds 23A and 24A respectively for the output-side interdigital electrode pairs 12 and 13 constituting the first stage SAW-filter $10_{-1}$, a ground terminal for the grounds 43A and 44A respectively for the output-side interdigital electrode pairs 42 and 43 of the second stage SAW-filter $10_{-2}$, input and output signal line patterns 131 and 132 represented with hatching, and dummy terminals 133 and 136 for the purpose of balancing. As represented in FIG. 12, these input terminal 20A, output terminal 46A, ground terminals 21A, 23A, 43A and 47A, and dummy terminals 133 and 136 are disposed on the bottom surface of the piezoelectric substrate 130 with a mutual separation. It should be noted that each of the foregoing terminals carries a solder bump (see FIG. 15A) for the purpose of flip-chip mounting.

The piezoelectric substrate 130 is typically formed of a Y-rotated $LiTaO_3$ single crystal slab with a rotational angle in the range of 40° Y to 44° Y. The interdigital electrode pairs are formed of a metal containing Al as a primary component and may have a thickness corresponding to 5–10% of the wavelength of the SAW excited on the substrate 130. Alternatively, the piezoelectric substrate 130 may be formed of a Y-rotated $LiNbO_3$ single crystal slab, with a rotational in the range of 66° Y to 74° Y. In this case, too, the interdigital electrodes are formed of a metal containing Al as a primary component and may have a thickness corresponding to 4–12% of the SAW wavelength on the substrate 130.

As represented in FIG. 10, the SAW-filter body 101 is mounted on the bottom plate 104 of the package body 102 by a flip-chip mounting process. Thereby, the input terminal 20A is connected to a part 111a of the input pad 111, the output terminal 46A is connected to a part 112a of the output pad 112, the ground terminal 21A is connected to a part $110_{-2a}$ of the ground pad $110_{-2}$, the ground terminals 23A and 24A are connected to a part $110_{-1a}$ of the ground pad $110_{-1}$, the dummy terminal 133 is connected to a part $110_{-2b}$ of the ground pad $110_{-2}$, the ground terminal 47A is connected to a part $110_{-1b}$ of the ground pad $110_{-1}$, the ground terminal 48A is connected to a part $110_{-2c}$ of the ground pad $110_{-2}$, and the dummy terminal 136 is connected to a part $110_{-1c}$ of the ground pad $110_{-1}$.

The SAW-filter package device 100 is mounted on a printed circuit board P in such a manner that the ground foot patterns 113 and 114, the input foot pattern 115 and the output foot pattern 116 are soldered to respective, corresponding pads on the printed circuit board P.

Figure 13:
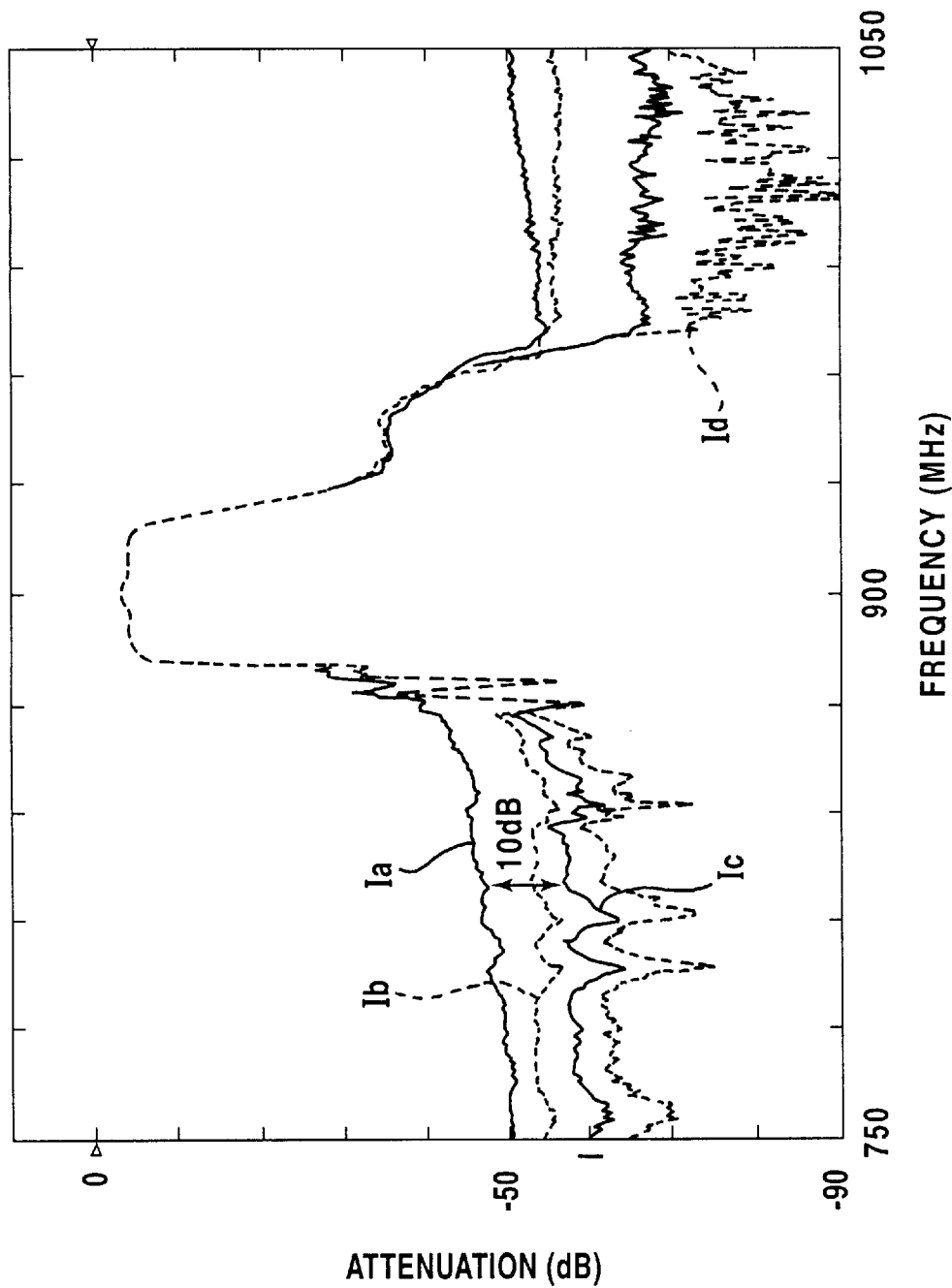
FIG. 13 is a diagram showing the frequency characteristic of the SAW-filter package device according to various embodiments of the present invention.

FIG. 13 shows the result of the frequency characteristic measurement conducted on the SAW-filter package device 100 in the state that the SAW-filter package device 100 is thus mounted on the printed circuit board P.

Figure 6:
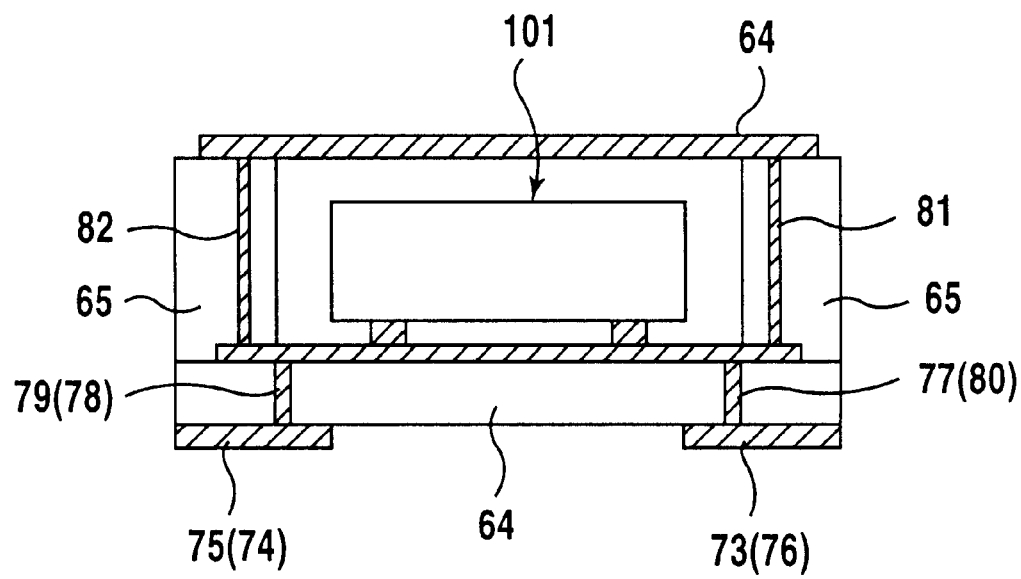
FIG. 6 is a diagram showing the construction of the SAW-filter package device of FIG. 4 in a cross-sectional view.
Figure 7:
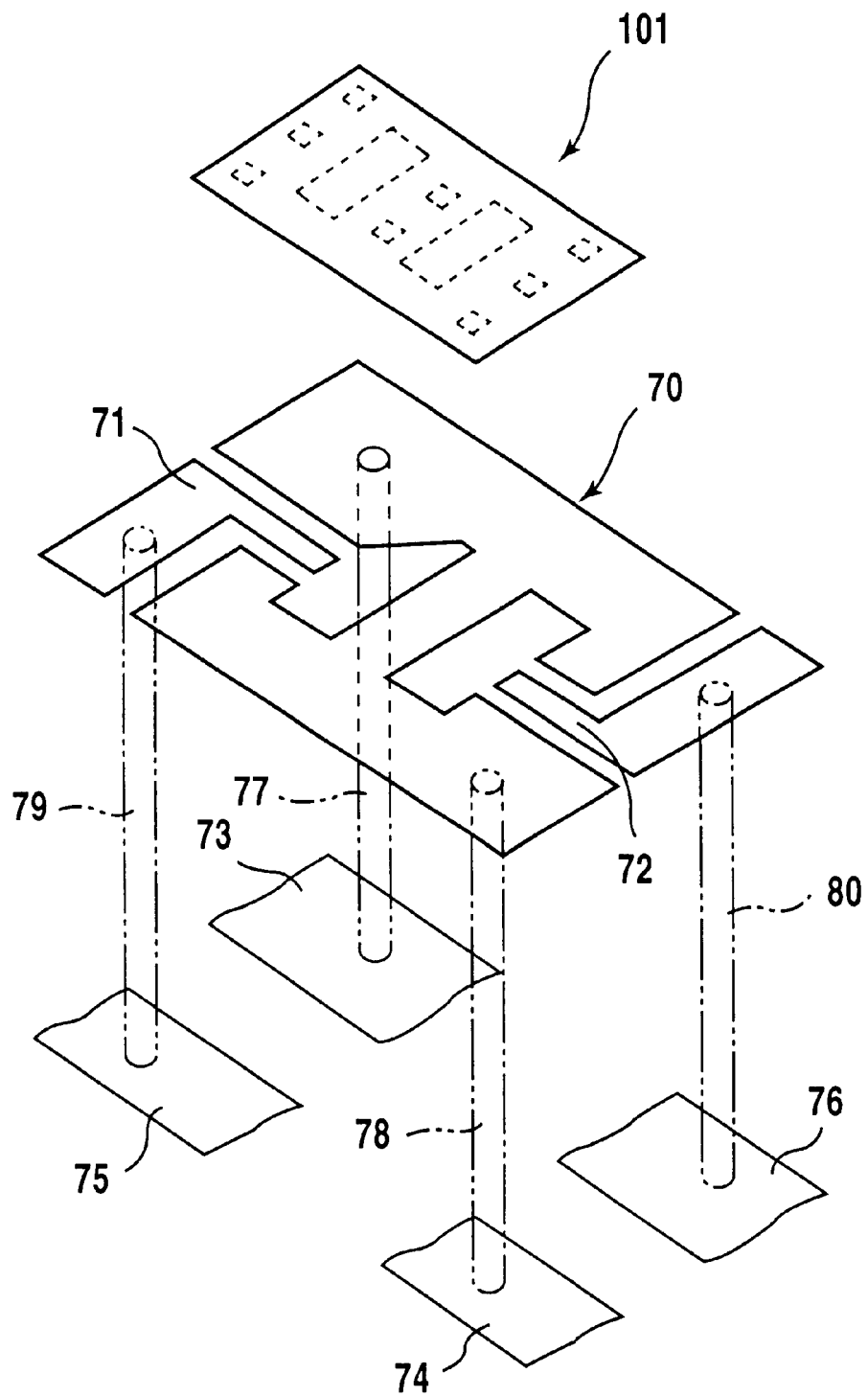
FIG. 7 is a diagram showing the electrical interconnection system used in the SAW-filter package device of FIG. 4.

Referring to FIG. 13, the curve Ia represents the result for a conventional case in which the ground pad $110_{-1}$ and the ground pad $110_{-2}$ are connected electrically to the same potential level and in which the conductor cap 103 is also grounded to the ground pads $110_{-1}$ and $110_{-2}$. Thus, the curve Ia corresponds to the result for the SAW-filter package device 60 of FIG. 6. Further, it should be noted that FIG. 13 shows, with the curve Ib, the result for the SAW-filter package device 100 of the present embodiment, except that the grounding of the conductor cap member 103 is eliminated. Further, the curve Ic represents the result of the SAW-filter package device of the present embodiment as represented in FIG. 10. The curve Id will be explained later with reference to a different embodiment.

As can be seen from FIG. 13, the SAW-filter package device has a pass-band in the vicinity of 900 MHz, wherein the suppression of the signal components outside the pass-band of the SAW-filter is increased in the order of the curve Ia, the curve Ib and the curve Ic, clearly indicating the effect of separation of the ground pads $110_{-1}$ and $110_{-2}$ (curve Ib) and further the effect of grounding the conductor cap member 103 to any one of the ground pads $110_{-1}$ and $110_{-2}$. By comparing the curve Ia and the curve Ic, it can be seen that the degree of suppression of the frequency component outside the pass-band is improved by about 10 dB by using the construction of the present embodiment.

Figure 14:
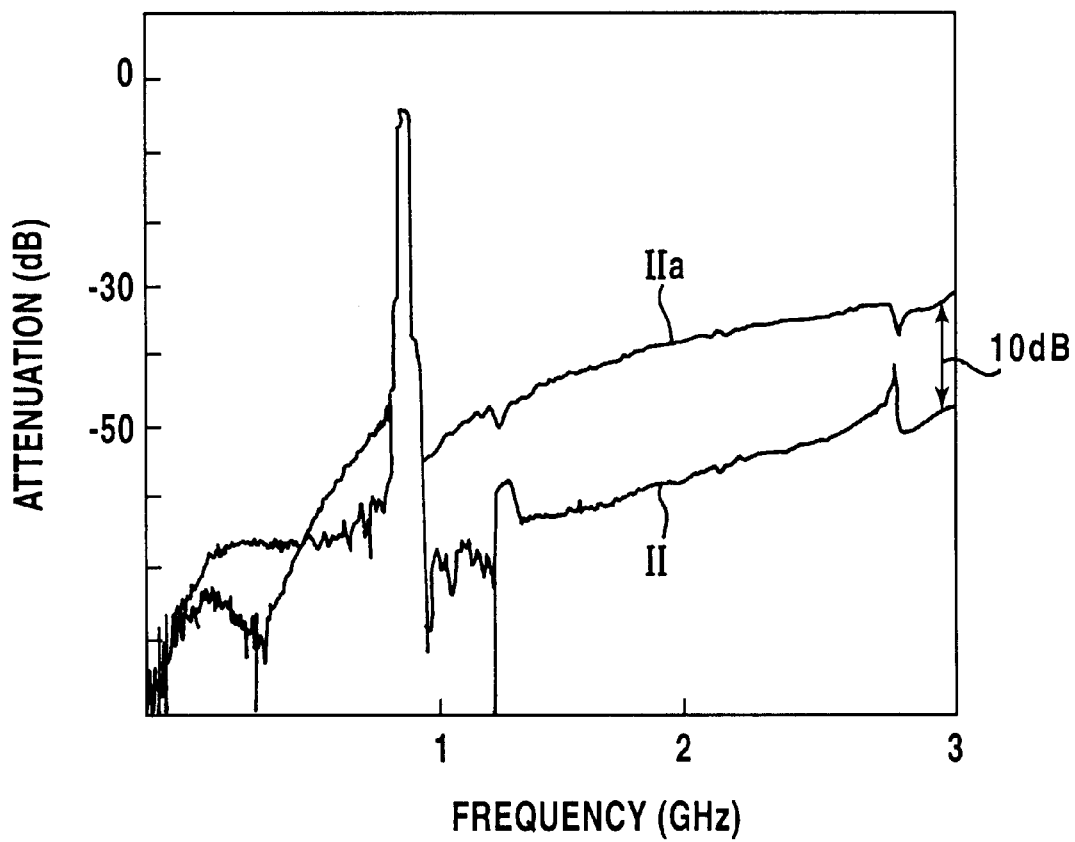
FIG. 14 is a diagram showing the frequency characteristic of the SAW-filter package device of FIG. 8 over an expanded frequency range.

FIG. 14 shows the same frequency characteristic represented by the curve Ia and the curve Ic for a wider frequency range, wherein the curve IIa corresponds to the curve Ia of FIG. 13 while the curve IIc corresponds to the curve Ic.

Referring to FIG. 14, it can be seen that a suppression of as much as 10 dB is obtained even in the case the frequency reaches 3 GHz, by employing the construction of the SAW-filter package device 100 of the present embodiment, as compared with the case of the SAW-filter package device 60. Thus, the present embodiment is extremely effective for cutting the unwanted high-frequency components or harmonic noise that are generated as a result of the interference of different SAW-filters of respective, different frequencies, as in the case of portable telephones.

The SAW-filter package device 100 is the following features.

(1) MUTUALLY SEPARATED GROUND PADS

As represented in FIG. 11, the ground pads $110_{-1}$ and $110_{-2}$ are separated by an intervening cutout part 140 on the top surface of the bottom plate 104. Thus, with regard to the package body 102, the grounding of the SAW-filter body 101 is achieved via a first ground system including the ground pad $110_{-1}$, the via-hole 117 and the ground foot pattern 113, and further via a second ground system including the ground pad $110_{-2}$, the via-hole 118 and the ground foot pattern 114.

The SAW-filter body 101 itself is mounted on the top surface of the bottom plate 104 in such a state that the ground terminal 21A for the input-side interdigital electrode pair 11 of the single-type SAW-filter element $10_{-1}$ of the first stage is connected to the ground pad $110_{-2}$ and that the ground terminal 41A for the output-side interdigital electrode pair 46 of the single-type SAW-filter element $10_{-2}$ of the second stage is connected to the ground pad $110_{-1}$.

In other words, the first ground system and the second ground system of the SAW-filter body 101 are not common but are separated from each other. In the representation of FIG. 3, the ground 21 of the SAW interdigital electrode pair 11 is isolated from the ground 47 of the interdigital electrode pair 41.

Because of the separation of the ground 21 and the ground 47, the problem of interference of ground potential between the SAW-filter element $10_{-1}$ and the SAW-filter element $10_{-2}$ is successfully eliminated. Thereby, the desired suppression of unnecessary frequency components is achieved not only in the vicinity of the pass-band but also in the higher frequency band of several GHz.

(2) MUTUAL SEPARATION BETWEEN SIGNAL PATTERN 131 (132) OF SAW FILTER BODY AND GROUND PAD $110_{-1}$ ($110_{-2}$) OF PACKAGE BODY 102

Figure 15A:
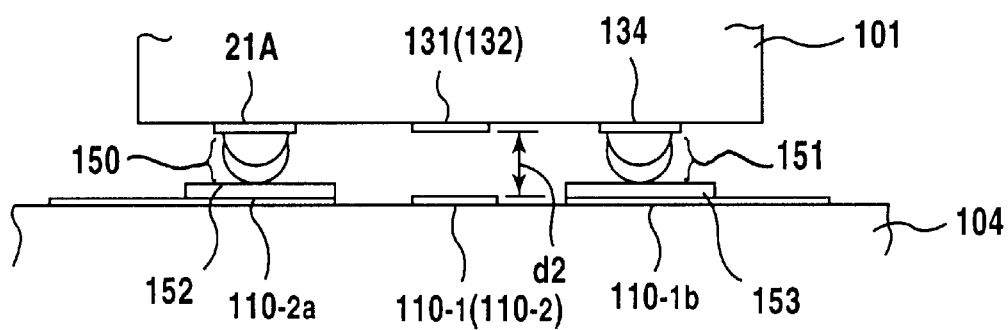
FIGS. 15A and 15B are diagrams showing the details of mounting of the SAW-filter body on a package body in the SAW-filter package device of FIG. 8 in comparison with the case of the conventional SAW-filter package device of FIG. 4.

As represented in detail in an enlarged view of FIG. 15A, each terminal such as the ground terminal 21A and the dummy terminal 134 of the SAW-filter body 101 carries a dual bump structure including stacked bumps 150 and 151. Further, the part of the package body 102 (such as the part $110_{-b}$ and $110_{-2a}$) on which an electric interconnection to a corresponding terminal of the SAW-filter body 101 is provided with plated Au patterns 152 and 153. It should be noted that the Au patterns 152 and 153 constitutes a projection on the top surface of the bottom plate 104. On the other hand, the stacked bump structure on the SAW-filter body 101 is formed by first forming a bump and then stacking another bump on the foregoing bump thus formed previously. The Au patterns 152 and 153 may be formed by a screen printing process.

As represented in FIG. 15A, the SAW-filter body 101 is mounted on the bottom plate 104 of the package body 102 by engaging the stacked bump structures 150 and 151 with the Au patterns 152 and 153, respectively.

Figure 15B:
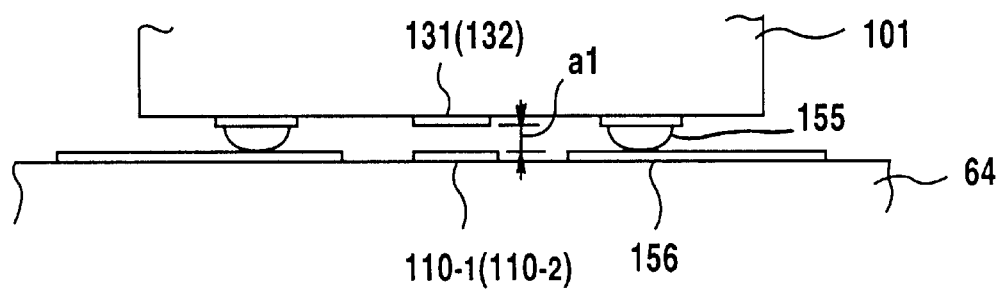

FIG. 15B, on the other hand, shows a conventional construction in which a single bump 155 is connected with a pad 156 directly. In FIG. 15B, those parts corresponding to the parts described previously are designated by the same reference numerals and the description thereof will be omitted.

In the case of FIG. 15B, it will be noted that the distance from the signal pattern 131 or 132 to the ground pad is represented by "$a_1$," while this distance $a_1$ is substantially smaller than a distance $a_2$ between the signal pattern 131 or 132 on the SAW-filter body 101 and the ground pad $110_{-1}$ or $110_{-2}$. In other words, the distance $a_2$ is more than twice as large as the distance $a_1$, and the interference between the signals on the SAW-filter body 101 and the ground potential on the package body 102 is effectively suppressed. As a result of such a successful suppression of the interference, the SAW-filter package device 100 of the present invention can suppress the frequency components outside the pass-band effectively.

In the SAW-filter package device 100 of FIG. 15A, it is also possible to eliminate the plated Au pattern 152 or 153. In such a construction, the separation $a_2$ is reduced construction as compared with the construction of FIG. 15A, while such a modification is still effective for suppressing the interference. Alternatively, it is also possible to provide the Au patterns 152 and 153 while using the single bump structure in the construction of FIG. 15A.

Because of the increased distance between the bottom surface of the SAW-filter body 101 and the top surface of the bottom plate 104 in the package body 102, the problem of accidental contact of the electrode structure on the SAW-filter body 101 with the top surface of the bottom plate 104 is positively prevented, even in such a case the SAW-filter is mounted in a tilted state. In other words, a larger tilting angle is allowed for the SAW-filter body 101 on the bottom plate 104 of the package body 102 in the present embodiment as compared with the conventional SAW-filter package device 60 explained before with reference to FIG. 6. Thereby, the yield of production of the SAW device is improved substantially by employing the structure of the SAW-filter package device 100 of the present embodiment.

(3) SEAL RING

Figure 16C:
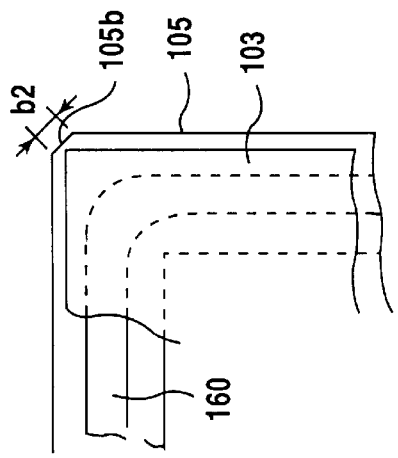
FIGS. 16A–16F are diagrams showing the details of a cap member used in the SAW-filter package device of FIG. 8 in comparison with the cap member used in the SAW-filter package device of FIG. 4.
Figure 16B:
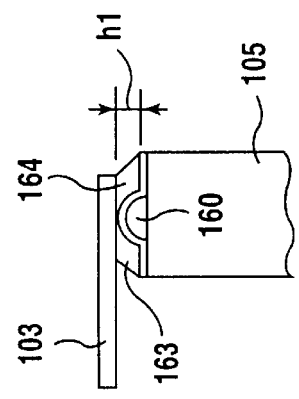
Figure 16A:
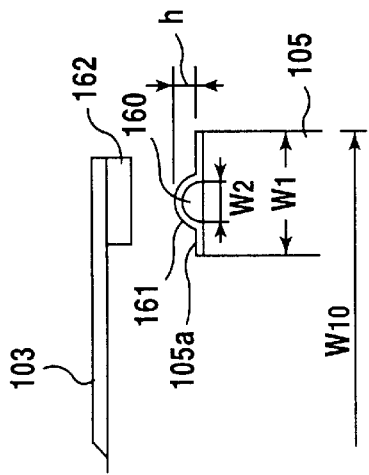

As represented in FIG. 8 and FIG. 9A, there is provided a seal ring 160 on a top surface 105a of the rectangular frame member 105. As represented in FIG. 16A, the seal ring 160 has a semi-circular cross-section and projects in the upward direction from the top surface 105a of the frame member 105. The seal ring 160 extends continuously along the top surface 105a at a laterally central part thereof, to form a closed, rectangular ring.

Typically, the seal ring 160 is formed of W and is provided so as to form a space for accommodating therein a solder layer. More specifically, the seal ring 160 has a width $w_2$ substantially smaller than a width $w_1$ of the frame member 105 and projects in the upward direction by a height $h_1$ as measured from the top surface 105a. It should be noted that the top surface 105a and the seal ring 160 are covered by a plated Au layer 161, while a layer 162 of an Au—Sn solder alloy is formed underneath the conductor cap member 103. The Au—Sn solder layer extends continuously along the top surface 105a of the frame member 105.

It should be noted that the cap member 103 soldered upon the frame member 105 by placing the cap member 103 on the top surface 105a of the frame member 105 and then causing the frame member 105 to pass through a reflowing furnace. Thereby, the layer 162 of the Au—Sn solder alloy undergoes melting and the cap member 103 is soldered on the frame member 105 as represented in FIGS. 16B and 16C. Thereby, the SAW-filter body 101 is hermetically sealed in the package body 102. As a result of the melting of the solder alloy layer 162, there is formed a molten solder layer such that the molten solder layer fills a space 163 formed on the top surface 105a of the frame member 105 adjacent to the seal ring 160 with a height $h_1$. Thereby, the cap member 103 is mechanically supported by the seal ring 160, while the seal ring 160 simultaneously functions to prevent the escape of the molten solder alloy.

Contrary to the present invention, the conventional SAW-filter package device 60 explained before lacks the seal ring as represented in FIGS. 16D–16F. Thereby the molten solder alloy 164 spreads laterally on the top surface of the frame member 65, while the construction of FIGS. 16D–16F requires a substantial width $w_3$ for achieving a reliable contact between the cap member 63 and the frame member 65. In the SAW-filter package device 100 of the present embodiment, on the other hand, the width $w_1$ of the frame member 105 can be reduced substantially over the conventional width $w_3$, and hence the overall size of the SAW-filter package device 100 is reduced to $w_{10}$ as compared with the overall size $wl_{11}$ for the SAW-filter package device 60. Because of the reduced size, the SAW-filter package device 100 is suitable for mounting on the printed circuit board with an increased density.

Figure 16F:
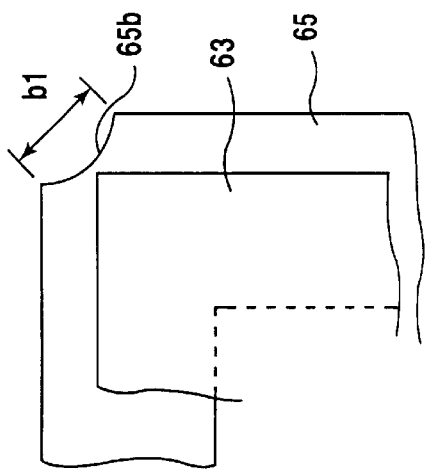
Figure 16E:
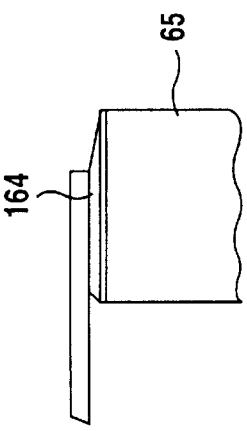
Figure 16D:
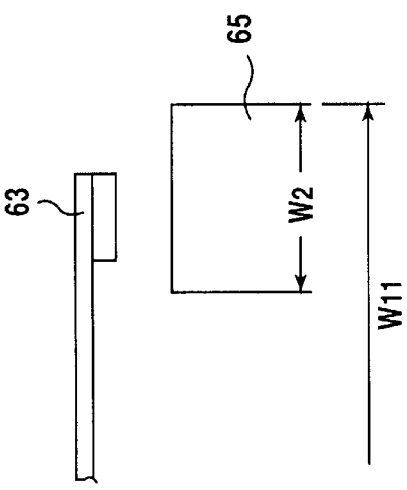

As represented in FIG. 16F, the conventional SAW-filter package device 60 is provided a cut or notch 65b at each corner of the frame member. 65 with a size $b_1$ for accepting excessive molten solder. In the SAW-filter 100 of the present embodiment, on the other hand, the frame member 105 is formed with a notch or cut 105b having a size $b_2$, wherein the primary purpose of the notch 105b is not to accept the molten solder but to merely confirm the proper mounting of the SAW-filter package device 100 on the printed circuit board. Thereby, the size $b_2$ for the SAW-filter package device 60 can be formed substantially smaller than the size $b_1$ of the SAW-filter package device 60. Thereby, the problem of decrease in the mechanical rigidity of the package body 102, caused by the notch 105b, is successfully eliminated in the SAW-filter 100.

SECOND EMBODIMENT

Figure 17:
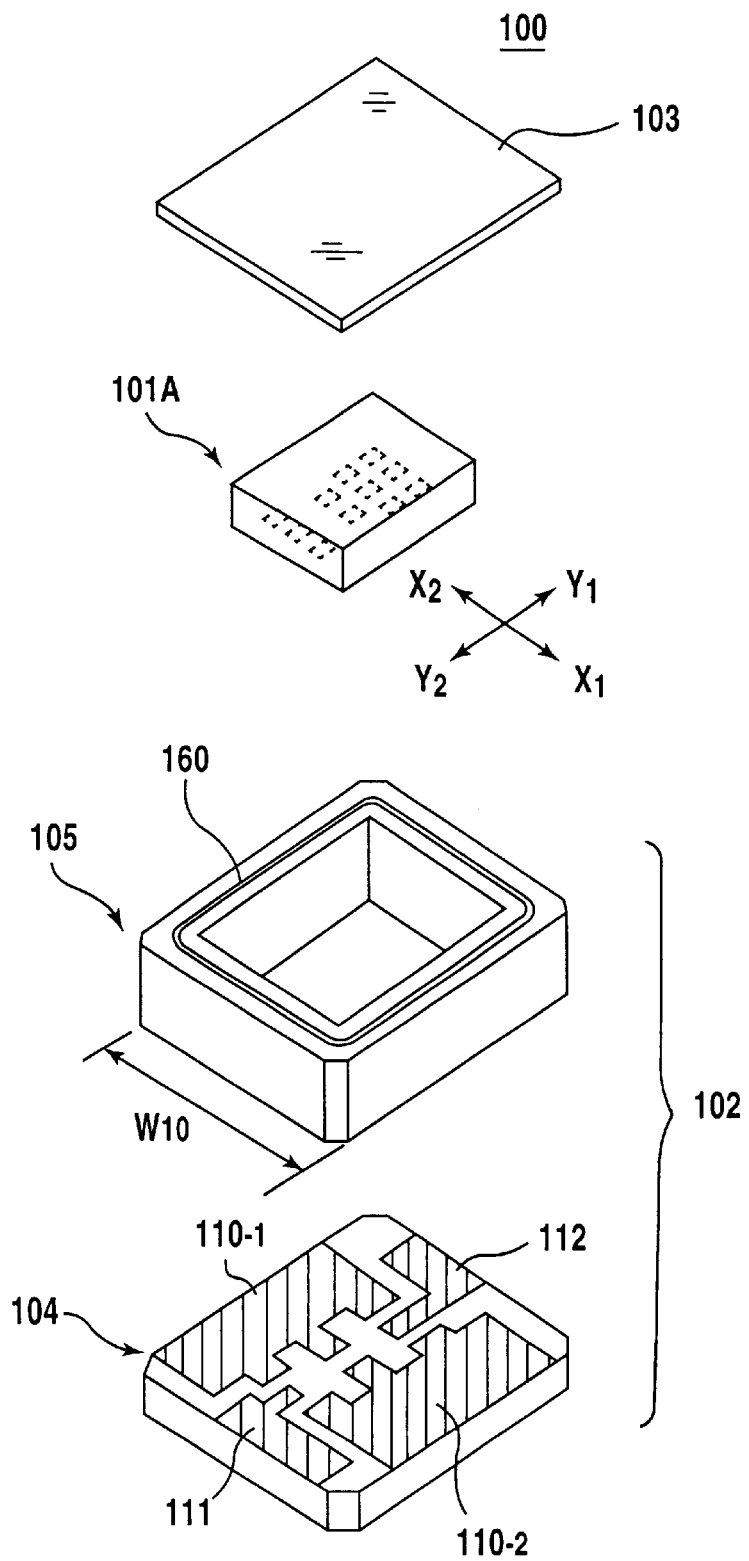
FIG. 17 is a diagram showing the construction of a SAW-filter package device according to a second embodiment of the present invention.
Figure 18:
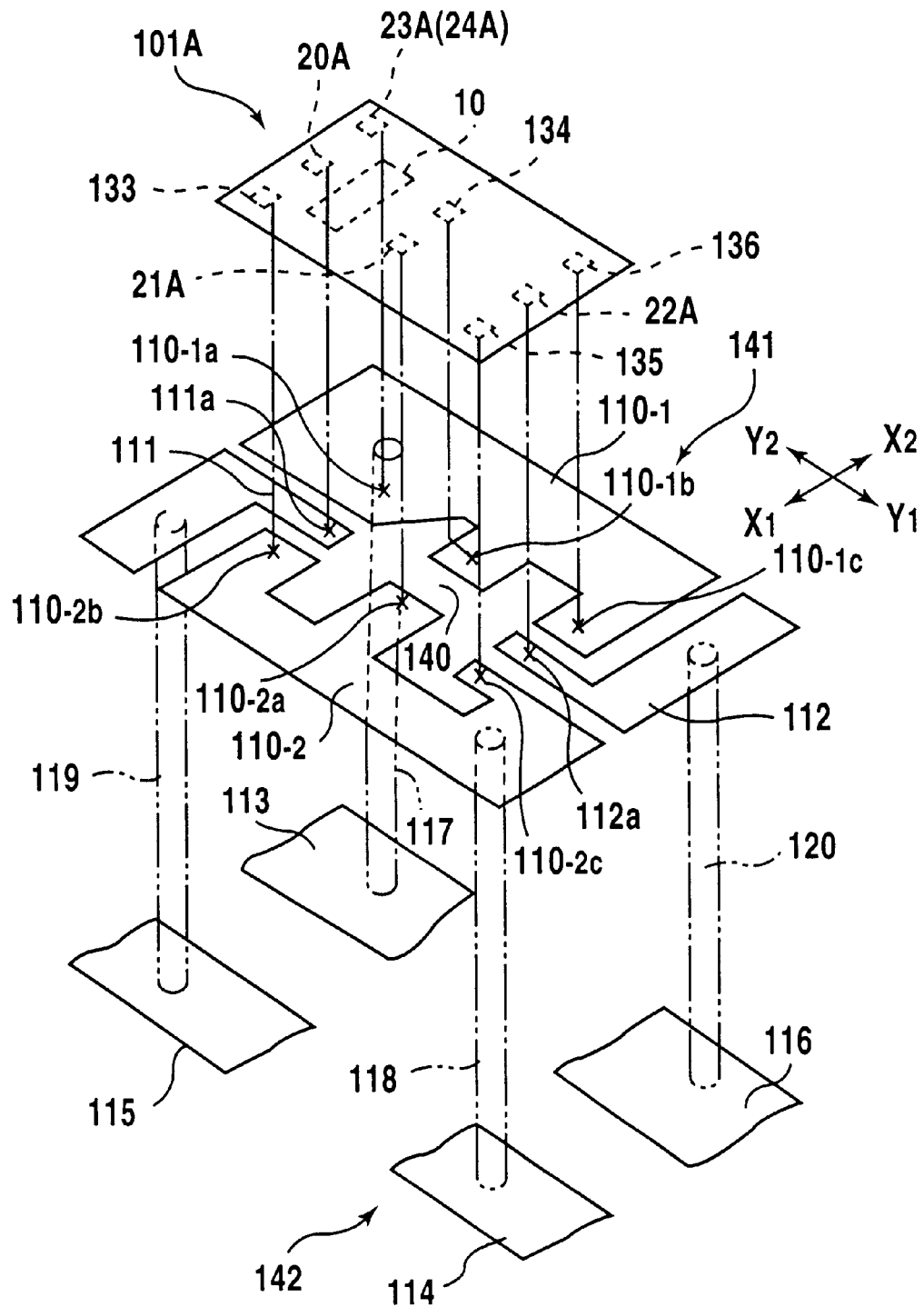
FIG. 18 is a diagram showing the electrical system of the SAW-filter package device of FIG. 17.
Figure 19:
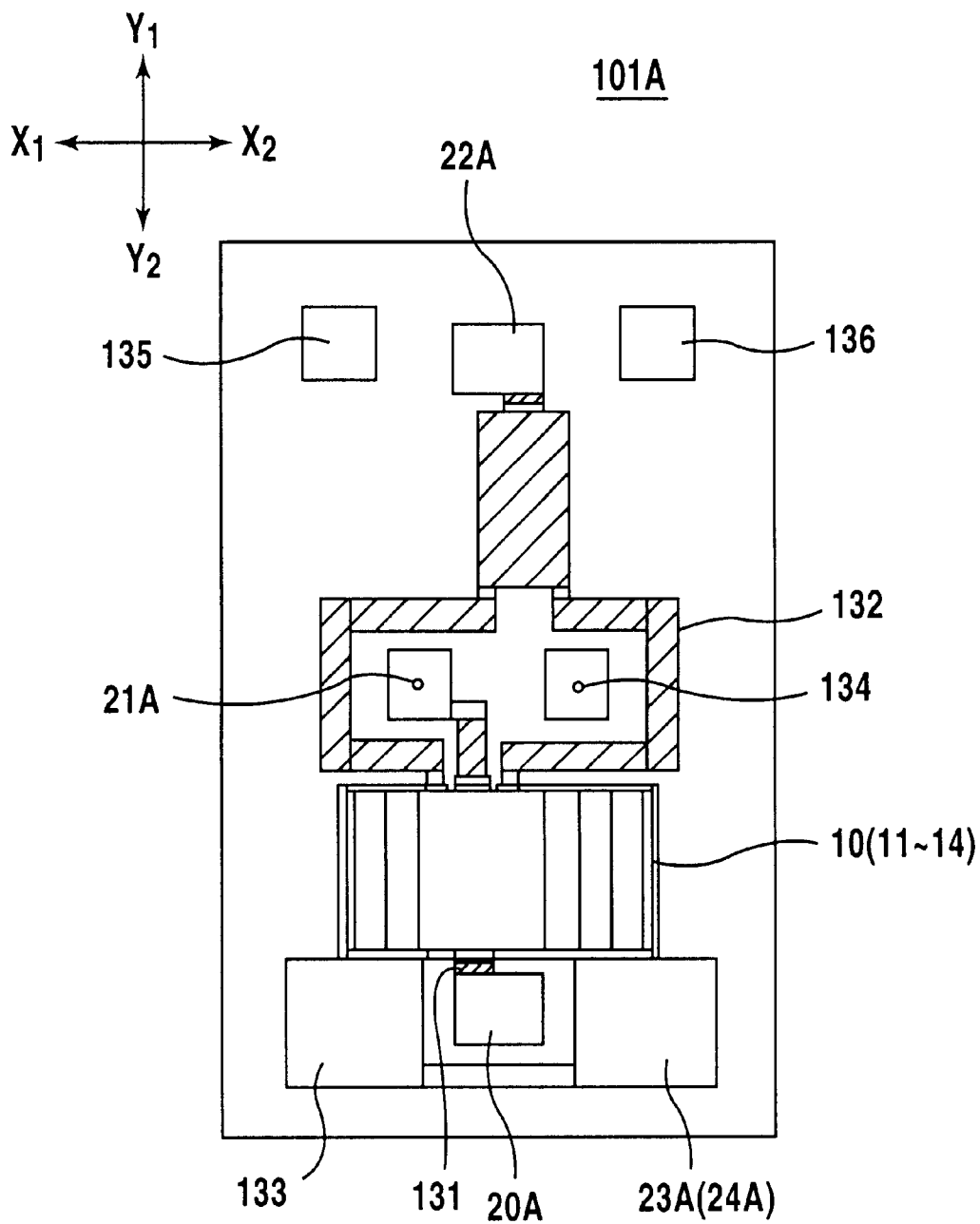
FIG. 19 is a diagram showing the construction of a SAW-filter body used in the SAW-filter package device of FIG. 17 in a bottom view.

FIGS. 17–19 show the construction of a SAW-filter package device 100A according to a second embodiment of the present invention, wherein those parts corresponding to the parts described previously are designated by the same reference numerals and the description thereof will be omitted.

Referring to the drawings, the SAW-filter package device 100A uses a SAW-filter body 101A of FIG. 19 in place of the SAW-filter body 101 of FIG. 8, wherein the SAW-filter body 101A is mounted on the bottom plate 104 of the package body by a flip-chip bonding process.

Referring to FIG. 19, the SAW-filter body 101A includes the piezoelectric substrate 130, wherein the piezoelectric substrate 130 carries, on a bottom surface thereof, the double-mode SAW-filter element 10 of the single-type explained with reference to FIG. 1A. In FIG. 19, it can be seen that there are formed, on the bottom surface of the piezoelectric substrate 130, the input terminal 20A, the output terminal 22A, the ground terminal 21A for the input-side interdigital electrode pair 11, and the ground terminals 23A and 24A for the output-side interdigital electrode pair 12 or 13. Further, the input signal pattern 131, the output signal pattern 132, and the dummy patterns 133–136 are formed as represented in FIG. 19, wherein it will be noted that each of the input terminal 20A, the output terminal 22A, the ground terminals 21A and 23A, and the dummy terminals 133–136 is disposed with a separation from each other. Further, each terminal carries thereon a bump electrode for flip-chip mounting. See FIG. 15A.

Referring to FIG. 18, it will be noted that the SAW-filter body 101A is mounted on the bottom plate 104 of the package body 102 by a flip-chip bonding process, wherein the mounting of the SAW-filter body 101A is achieved such that input terminal 20A is connected to the part 111a of the input pad 111, the output terminal 22A is connected to the part 112a of the output pad 112, the ground terminal 21A is connected to the part $110_{-2a}$ of the ground pad $110_{-2}$, the ground terminals 23A and 24A are connected to the part $110_{-1a}$ of the ground pad $110_{-1}$ the dummy terminal 133 is connected to the part $110_{-2b}$ of the ground pad $110_{-2}$, the dummy terminal 134 is connected to the part $110_{-1b}$ of the ground pad $110_{-1}$, the dummy terminal 135 is connected to the part $110_{-2c}$ of the ground pad $110_{-2}$, and the dummy terminal 136 is connected to the part $110_{-1c}$ of the ground pad $110_{-1}$. Thus, in the mounted state of the SAW-filter body 101A on the bottom plate 104, the ground terminal 21A of the input-side interdigital electrode pair 11 is connected to the ground pad $110_{-2}$ and the ground terminals 23A and 24A of the output interdigital electrode pair 12 and 13 are connected to the ground pad $110_{-1}$.

As will be understood, the ground for the input interdigital electrode pair 11 is not common in the SAW-filter package device 100A before the mounting on the printed circuit board with the ground for the output interdigital electrode pair 12 or 13. In the diagram of FIG. 1A, the ground 23 or 24 is disconnected from the ground 21.

By separating the ground for the input interdigital electrode pair 11 and the ground for the output interdigital electrode pair 12 or 13 as such, the problem of interference between the ground potential of the input-side interdigital electrode pair and the ground potential of the output-side interdigital electrode pair, is successfully eliminated.

THIRD EMBODIMENT

Figure 20:
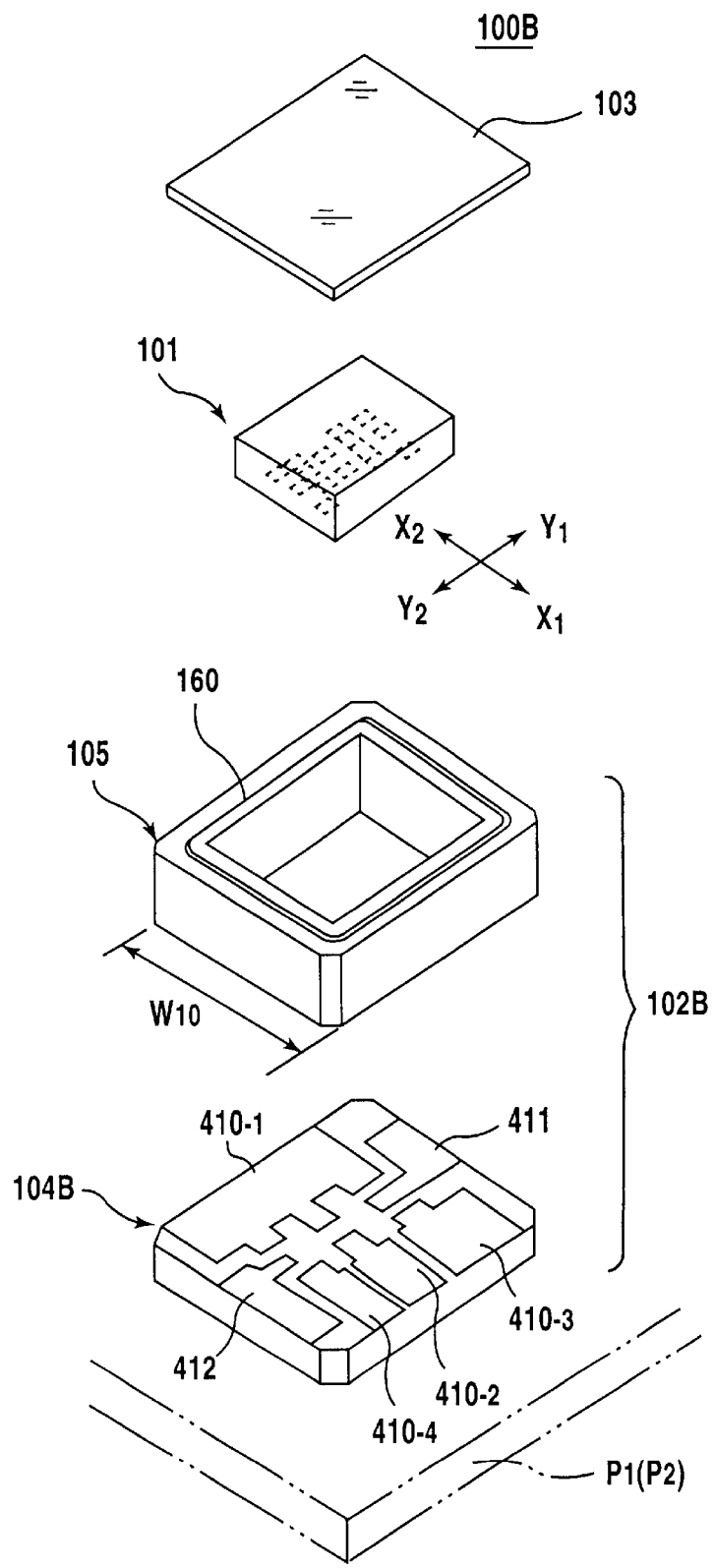
FIG. 20 is a diagram showing the construction of a SAW-filter package device according to a third embodiment of the present invention.
Figure 21A:
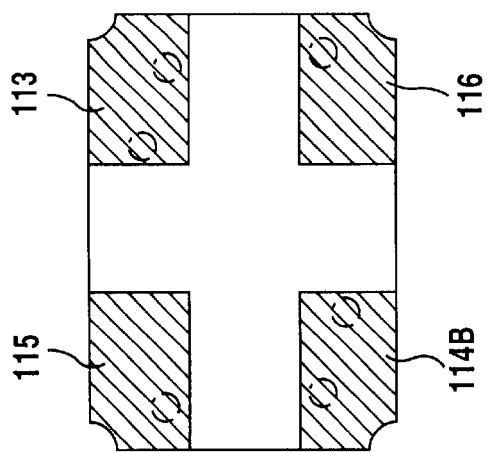
FIG. 21A–21D show the SAW-filter package device of FIG. 20 respectively in a top plan view, a side view, a bottom plan view, and in an equivalent circuit diagram.
Figure 21B:
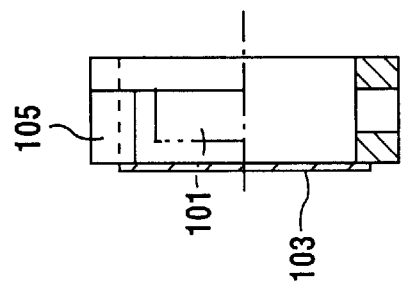
Figure 21C:
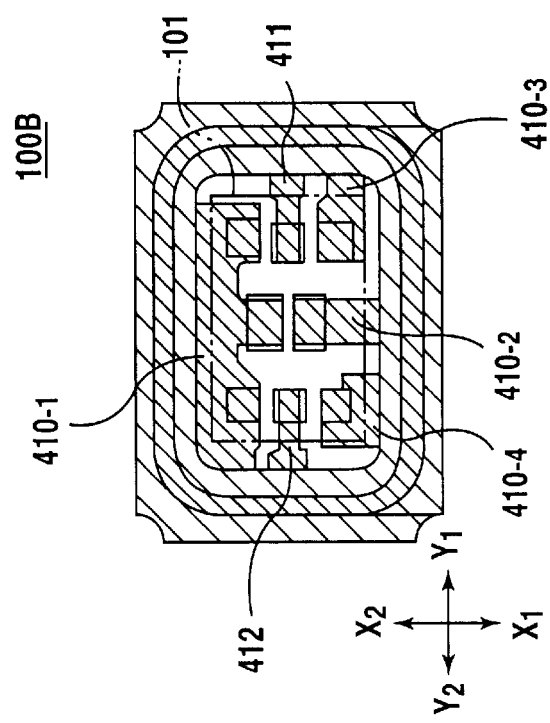
Figure 21D:
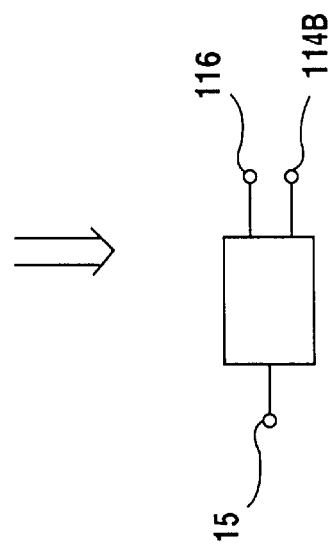
Figure 22:
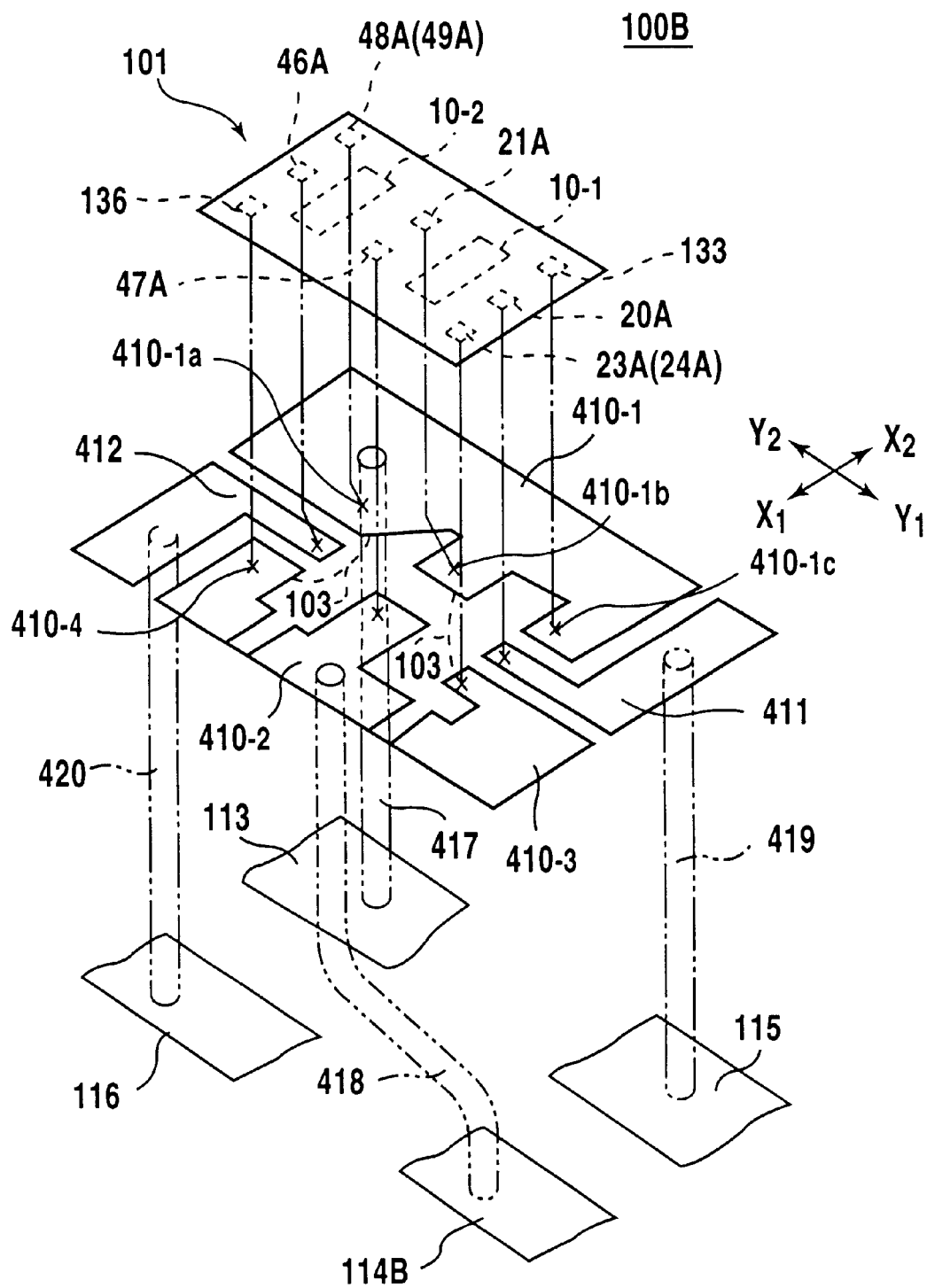
FIG. 22 is a diagram showing the electrical interconnection system used in the SAW-filter package device of FIG. 20.
Figure 23:
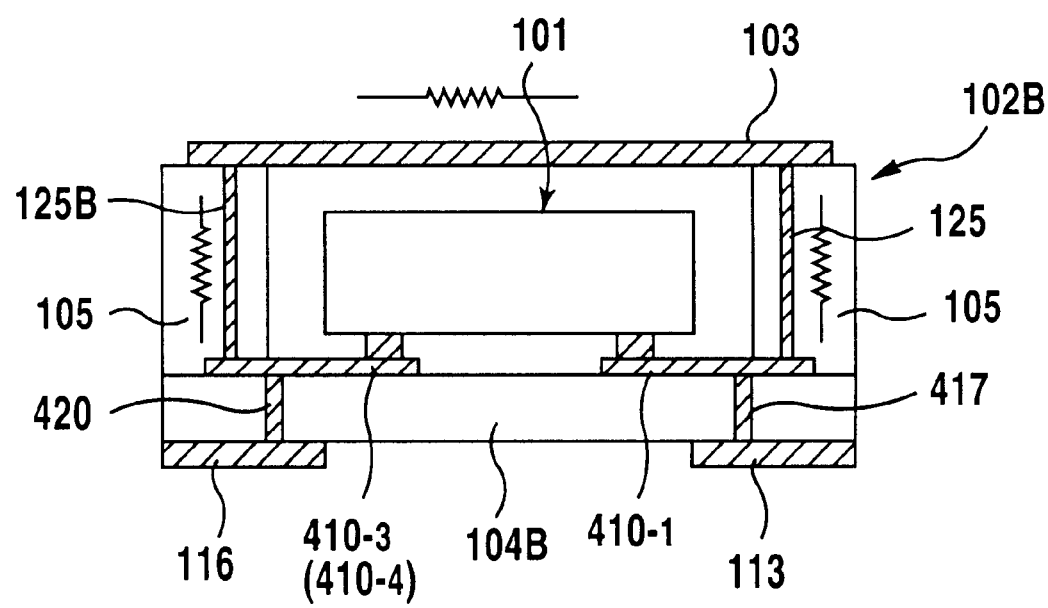
FIG. 23 is a diagram showing the construction of the SAW-filter package device of FIG. 20 in a cross-sectional view.

FIG. 20, FIGS. 21A–21D, FIG. 22 and FIG. 23 show the construction of a SAW-filter package device 100B according to a third embodiment of the present invention, wherein FIG. 20 shows the SAW-filter package device 100B in an exploded view, FIGS. 21A–21C show the SAW-filter package device 100B respectively in a top plan view, a side view and a bottom plan view, FIG. 21D shows the equivalent circuit diagram, FIG. 22 shows the electrical interconnection formed in the SAW-filter package device 100B, while FIG. 23 shows the SAW-filter package device 100B in a cross-sectional view. In the drawings, those parts corresponding to the parts described previously are designated by the same reference numerals and the description thereof will be omitted.

Referring to the drawings, the SAW-filter package device 100B uses a package body 102B including therein a bottom plate 104B in place of the package body 102 and the bottom plate 104 of the previous embodiment, wherein the SAW-filter package device 100B is distinguished over the SAW-filter package device 100 of FIG. 8 only in the shape of the bottom plate 104B. The same SAW-filter body 101 of FIG. 12 is used also in the present embodiment.

Referring to the drawings, the bottom plate 104B carries, on a top surface thereof, a first ground pad $410_{-1}$, a pad $410_{-2}$, second ground pads $410_{-3}$ and $410_{-4}$, an input pad 411, and further an output pad 412, wherein the first ground pad $410_{-1}$ and the pad $410_{-2}$ are separated from each other. Further, the second ground pad $410_{-3}$ and $410_{-4}$ are separated from each other. The second ground pads $410_{-3}$ and $410_{-4}$ are separated from the pad $410_{-2}$. As will be explained later, while the first ground pad $410_{-1}$ is geometrically separated from the ground pad $410_{-3}$ or $410_{-4}$, the first ground pad $410_{-1}$ is connected electrically to the ground pads $410_{-3}$ and $410_{-4}$ via a predetermined resistance, more precisely an impedance.

Further, the bottom plate 104B carries, on a bottom surface thereof, the ground foot pattern 113 and a foot pattern 114B so as to oppose with each other on a diagonal line. Further, the input foot pattern 115 and the output foot pattern 116 are disposed on another diagonal line.

In the bottom plate 104B, there is provided a via-hole 417 connecting the first ground pad $410_{-1}$ and the ground foot pattern 113, and another via-hole 418 connects the pad $410_{-2}$ to the foot pattern 114B. Further, a via-hole 419 is provided so as to connect the input pad 411 and the input foot pattern 115, and a via-hole 420 is provided so as to connect the output pad 412 and the output foot pattern 116.

As represented in the cross-sectional view of FIG. 23, the frame member 105 is formed with an internal via-hole 125 connecting the first ground pad $410_{-1}$ and the cap member 103. Similarly, there is provided another internal via-hole 125B in the frame member 105 wherein the internal via-hole 125B connects the second ground pads $410_{-3}$ and $410_{-4}$ to the cap member 103. Thereby, it will be noted that the first ground pad $410_{-1}$ is connected to the second ground pad $410_{-3}$ and $410_{-4}$ via the via-hole 125, the cap member 103 (including the seal ring 160) and the via-hole 125B, with a predetermined resistance, more precisely an impedance. Typically, the via-holes 125A and 125B are filled with W having a resistivity of $5.5 \times 10^{-10}$ Ωcm, wherein this value of resistivity is higher than the resistivity of Co used for the cap member 103. The foregoing predetermined resistance is set such that the interference of ground potential between the first ground pad $410_{-1}$ and the second ground pad $410_{-3}$ or $410_{-4}$ is effectively suppressed.

In FIG. 23, it should be noted that the conductor patterns in the internal via-holes 125 and 125B are required to have a predetermined impedance, while the resistance itself may be substantially zero. In other words, increased resistance is not required for the conductor patterns filling the via-holes 125A and 125B. Similarly, the cap member 103 may be formed of a low-resistance conductor material.

It should be noted that the SAW-filter body 101 is mounted on the bottom plate 104B of the package body 102B in a face-down state by a flip-chip bonding process. As represented in FIG. 21, the input terminal 20A (primary-side terminal of the input-side interdigital electrode pair forming the input stage of the cascaded SAW electrode structure) is connected to the input pad 411, the output terminal 46A (secondary-side terminal of the output-side interdigital electrode pair forming the output stage of the cascaded SAW electrode structure) is connected to the output pad 412, the ground terminal 21A (secondary-side terminal of the input-side interdigital electrode pair forming the input stage of the cascaded SAW electrode structure) is connected to a part $410_{-2b}$ of the first ground pad $410_{-2}$, the ground terminals 23A and 24A are connected to the second ground pad $410_{-3}$, the dummy terminal 133 is connected to a part $410_{-1c}$ of the first ground pad $410_{-1}$, the ground terminal 47A (primary-side terminal of the output-side interdigital electrode pair forming the output stage of the cascaded SAW electrode structure) is connected to the pad $410_{-2}$, the ground terminals 48A and 49A are connected to the part $410_{-1a}$ of the first ground pad $410_{-1}$, and the dummy terminal 136 is connected to the second ground pad $410_{-4}$.

It should be noted that the SAW-filter package device 100B includes a single input foot pattern 115, a single output foot pattern 116, a single ground foot pattern 113 and a single foot pattern 114B.

Figure 24A:
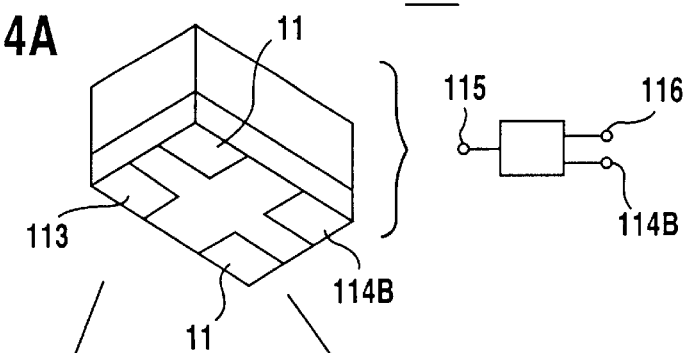
FIGS. 24A–24E are diagrams showing a mounting of the SAW-filter package device of FIG. 20 on a printed circuit board.
Figure 24B:
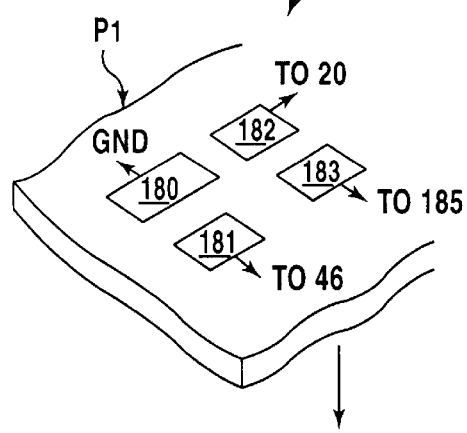
Figure 24D:
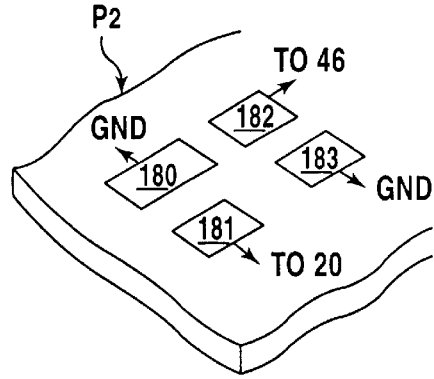
Figure 24C:
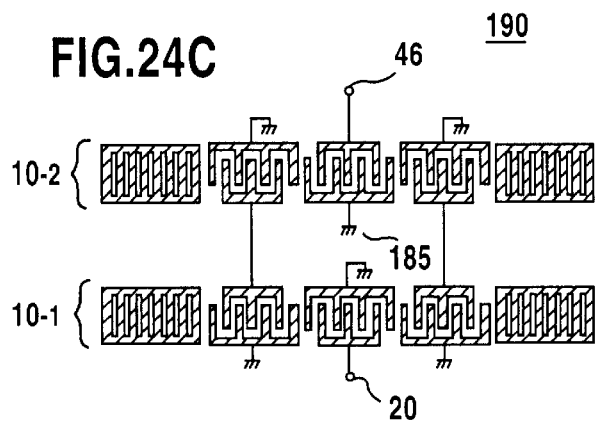
Figure 24E:
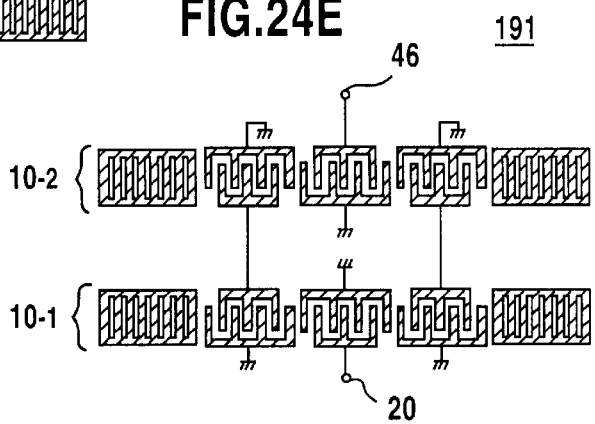

The SAW-filter package device 100B is usable in one of first and second modes, the first mode using the foot pattern 114 as a separate or second output terminal as represented in FIG. 24C, the second mode using the foot pattern 114 as a separate ground terminal as represented in FIG. 24E. Thus, the SAW-filter package device 100B can be used any of these two modes.

FIGS. 24A–24E show the foregoing mode of use of the SAW-filter package device 100B schematically represented in FIG. 24A.

In the first mode, a printed circuit board $P_1$, carrying thereon a ground pad 180, an input pad 181, a first output pad 182 and a second output pad 183, supports thereon the SAW-filter package device 100B in such a state that the ground foot pattern 113 is soldered to the pad 180, the input foot pattern 115 is soldered to the pad 181, the output foot pattern 116 is soldered to the pad 182, and the foot pattern 114B is soldered to the pad 183. Thereby, as represented in FIG. 24C, a SAW-filter circuit 190 similar to the SAW-filter circuit of FIG. 3 is formed on the printed circuit board $P_1$, with the printed circuit board $P_1$ forming a part thereof. In FIG. 24C, it will be noted that the ground terminal 47 is replaced with a second output terminal 185. The pad 183 is connected to the foregoing second output terminal 185.

It should be noted that the SAW-filter circuit 190 of FIG. 24C is a balanced type circuit characterized by two output terminals. Conventionally, such a balanced type SAW-filter circuit has used a conversion circuit for converting a non-balanced output in the form of balanced output, while the construction of FIG. 24C successfully produces the desired balanced output without using such a conversion circuit. Thereby, the number of parts is reduced substantially in an electronic apparatus such as a portable telephone apparatus by employing the SAW-filter circuit 190 of FIG. 24C.

Due to the balanced output construction, the SAW-filter circuit 190 is immune to noise. In addition, the SAW-filter circuit 190 successfully improves the suppression of the spurious components outside the pass-band.

It should be noted that, in the mounting process of the SAW-filter package on the printed circuit substrate described above with reference to FIGS. 24A–24E is effective also for the case of using the SAW-filter package 100 described previously or for the case of the SAW-filter package to be described in this specification.

Referring back to FIG. 13 explained before, it should be noted that the curve Id shows the frequency characteristic of the SAW-filter circuit 190 in the vicinity of the pass-band frequency.

Referring to FIG. 13, it will be noted that the suppression of spurious frequency components outside the pass-band is improved further by as much as about 10 dB in the present embodiment as compared with the case of the first embodiment shown in FIG. 13 by the curve Ic.

Figure 25:
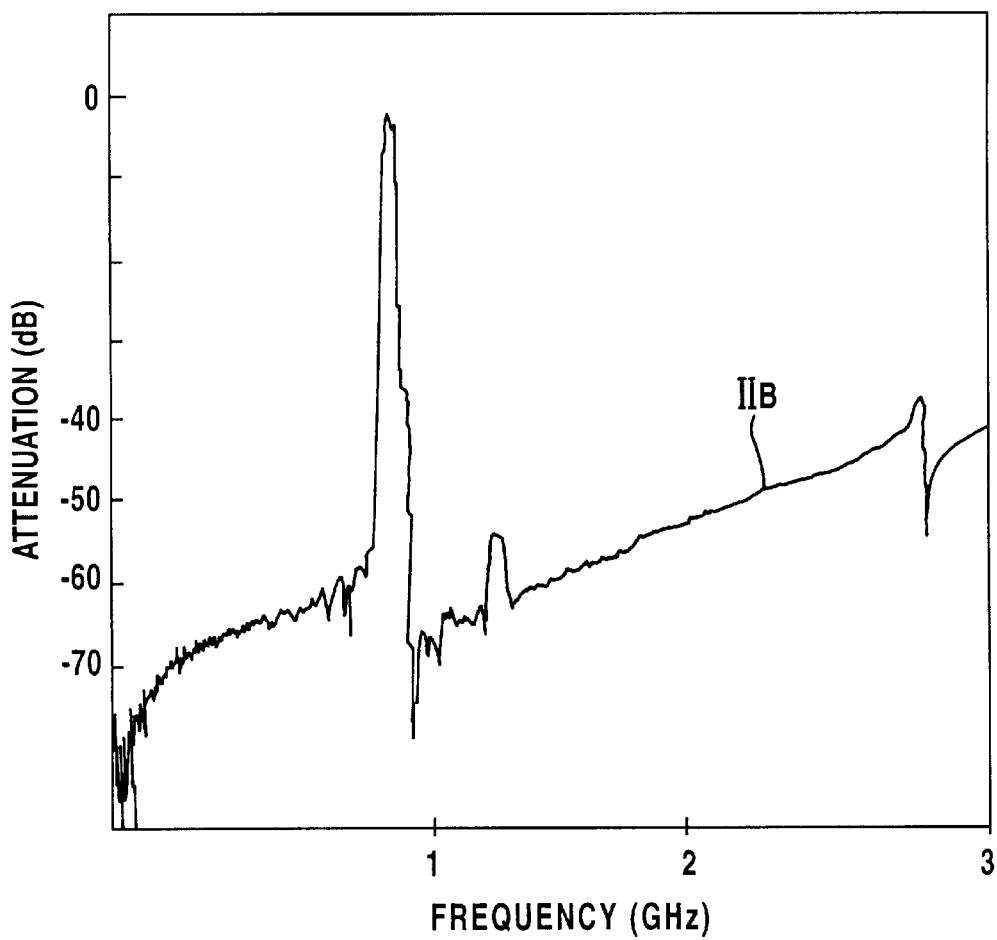
FIG. 25 is a diagram showing the frequency characteristic of the SAW-filter package device of FIG. 20.

Further, FIG. 25 shows the frequency characteristic of the SAW-filter circuit 190 over an expanded frequency range.

Similarly to the diagram of FIG. 14, the SAW-filter circuit 190 shows an improved suppression of spurious frequency components outside the pass-band up to the frequency of as high as 3 GHz or more.

In the second mode, the SAW-filter package device 100B is mounted on a printed circuit board $P_2$ carrying thereon the pad 180 connected to the grounded, the pad 181 connected to the input terminal 20, the pad 182 connected to the output terminal 46, and the pad 183 connected to the ground.

The SAW-filter package device 100B is then mounted on the printed circuit board $P_2$ in such a state that the ground foot pattern 113 is connected to the pad 180, the input foot pattern 115 is connected to the pad 181, the output foot pattern 116 is connected to the pad 182, and the foot pattern 114B is connected to the pad 183. Thereby, a SAW-filter circuit 191 shown in FIG. 24E is obtained in which it will be noted that the SAW-filter circuit 191 has a single input terminal and a single output terminal 46. The SAW-filter circuit 191 provides a similar frequency characteristic as the curve Id shown in FIG. 13 or the curve shown in FIG. 25.

FOURTH EMBODIMENT

Figure 26:
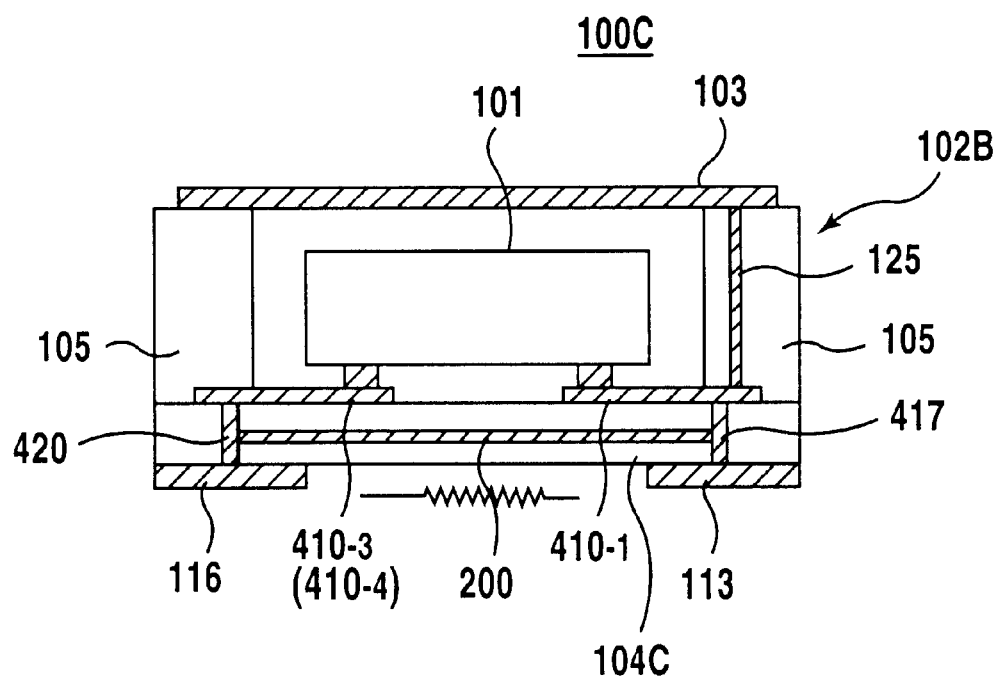
FIG. 26 is a diagram showing the construction of a SAW-filter according to a fourth embodiment of the present invention.

FIG. 26 shows the construction of a SAW-filter package device 100C according to a fourth embodiment of the present invention, wherein those parts corresponding to the parts described previously are designated by the same reference numerals and the description thereof will be omitted.

Referring to FIG. 26, the SAW-filter package device 100C uses a bottom plate 104C in the package body 102 in place of the bottom plate 104, wherein it will be noted that the bottom plate 104C includes a thin W pattern 200 connecting the ground pad $410_{-3}$ or $410_{-4}$ to the ground pad $410_{-1}$. Because of the relatively high resistivity of W, there is interposed an impedance between the foregoing ground pad $410_{-3}$ or $410_{-4}$ and the ground pad $410_1$, and the interference of the ground potential therebetween is effectively avoided.

The SAW-filter package device 100C shows a frequency characteristic similar to that of the curve Id of FIG. 13 when mounted on a printed circuit board.

FIFTH EMBODIMENT

Figure 27C:
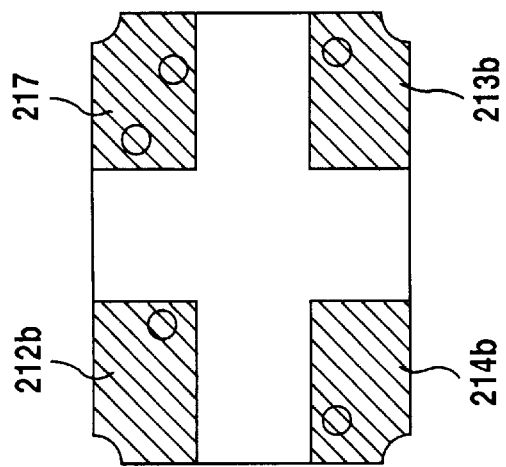
FIGS. 27A–27D are diagrams showing the construction of a SAW-filter package device according to a fifth embodiment of the present invention.
Figure 27B:
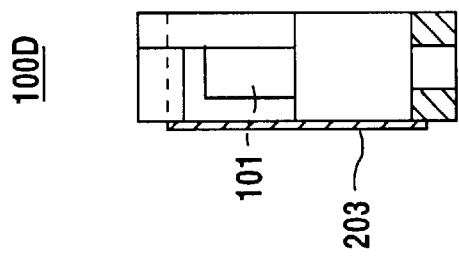
Figure 27D:
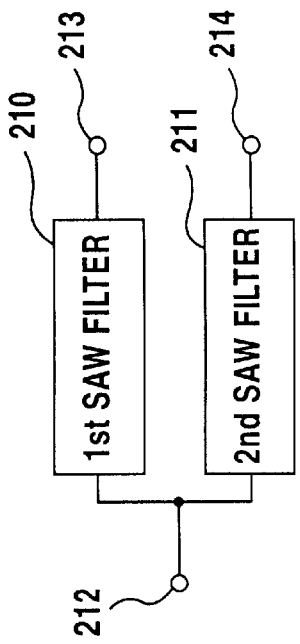
Figure 27A:
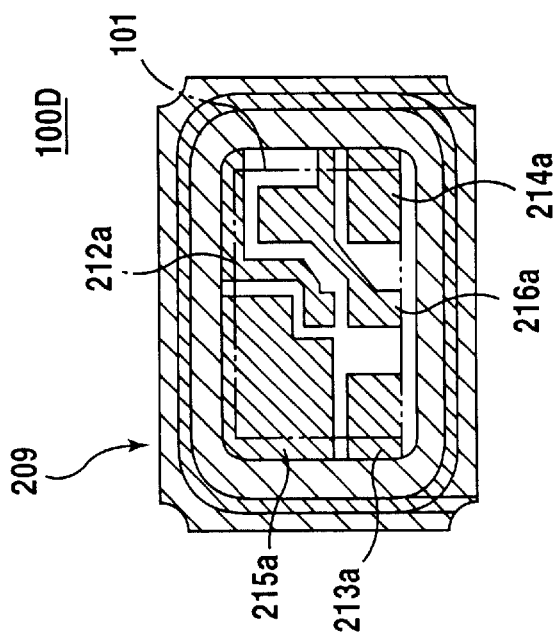

FIGS. 27A–27D and FIGS. 28A and 28B show the construction of a SAW-filter package device 100D according to a fifth embodiment of the present invention, wherein those parts corresponding to the parts described previously are designated by the same reference numerals and the description thereof will be omitted. It should be noted that FIGS. 27A–27C show the SAW-filter package device 100D respectively in a top plan view, a side view and a bottom plan view, while FIG. 27D shows an equivalent circuit diagram of the SAW-filter package device 100D.

Referring to FIG. 27A–27C, the SAW-filter package device 100D of the present embodiment includes a SAW-filter body 101D shown in FIGS. 28A and 28B mounted on a bottom plate of the package body 209 in a face-down state by a flip-chip bonding process, and there is formed a SAW-filter circuit as represented in FIG. 27D, wherein it should be noted that the SAW-filter circuit includes a first SAW-filter circuit 210 of a first type and a second SAW-filter circuit 211 of a second type, such that the first and second SAW-filter circuits 210 and 211 share a common input terminal 212. The SAW-filter circuits 210 and 211 have respective output terminals 213 and 214.

As represented in FIG. 28A, the package body 210 carries, on a top surface of the bottom plate, a common input pad 212a, a first output pad 213a, a second output pad 214a, a first ground pad 215a, and a second ground pad 216a, while the bottom plate carries, on a bottom surface thereof, a ground foot pattern 217, a common input foot pattern 212b, a first output foot pattern 213b and a second output foot pattern 214b. Thereby, the common input pad 212a and the common input foot pattern 212b are connected with each other via a via-hole formed in the bottom plate, the first output pad 213a is connected to the first output foot pattern 213b via a via-hole formed in the bottom plate, and the second output pad 214a is connected to the second output foot pattern 214b via a via-hole formed in the bottom plate. Further, the first ground pad 215a is connected to the ground foot pattern 217 via a via-hole in the bottom plate. In addition, the first ground pad 215a and the second ground pad 216a are electrically connected by a predetermined resistance, more precisely an impedance, of a path including the via-holes and the cap member similarly to FIG. 23. It should be noted that the package body 209 carries thereon a conductive cap 203 as represented in FIG. 27B. Thereby, the resistance is set to a value suitable for eliminating the interference of the ground potential between the first ground pad 215a and the second ground pad 216a.

As represented in FIGS. 28A and 28B, the SAW-filter body 101D carries, on a piezoelectric substrate thereof, the electrode structure forming the SAW-filter element $10_{-1}$ and the electrode structure forming the SAW-filter element $10_{-2}$ side by side, wherein the piezoelectric substrate further carries thereon a common input terminal 212c, an output terminal 213c for the SAW-filter element $10_{-1}$, and an output terminal 214c for the SAW-filter element $10_{-2}$. Further, the bottom plate carries thereon a ground terminal 218c for the input-side interdigital electrode pair used in the SAW-filter element $10_{-1}$, a ground terminal 219c for the output-side interdigital electrode pair of the SAW-filter element $10_{-1}$, a ground terminal 220c for the input-side interdigital electrode pair of the SAW-filter element $10_{-2}$, and a ground terminal 221c for the output-side interdigital electrode pair of the SAW-filter element $10_{-2}$.

The SAW-filter body 101D is thereby mounted on the bottom plate in such a manner that the common input terminal 212c is connected to the common input pad 212a, the output terminal 213c is connected to the output pad 213a, the output terminal 214c is connected to the output pad 213a, the ground terminal 218c and the two ground terminals 219c are connected to the first ground pad 215a, and the ground terminal 220c and the two ground terminals 221c are connected to the second ground pad 216a.

Thus, the ground terminals 218c and 219c of the first SAW-filter element (and hence the ground pad 215a and the ground foot pattern 217) and the ground terminals 220c and 221c of the second SAW-filter element (and hence the ground pad 216a) do not cause the problem of interference. Thereby, the SAW-filter package device 100D forms a dual-type SAW-filter having an improved frequency characteristic.

In the present embodiment, too, the frequency characteristic is further improved by grounding the cap member to any of the ground for the first SAW-filter element and the ground for the second SAW-filter element.

In a modification of the present embodiment, the conductive cap member 203 may be connected to one of the first and second ground pads 215a and 215b similarly to the construction of FIG. 10 or FIG. 26. In this modification, it is also possible to form another ground foot pattern in correspondence to the ground pad 216a. As such a modification is obvious in view of the description before, further description of the modification will be omitted.

SIXTH EMBODIMENT

FIGS. 29A–29D show the construction of a SAW-filter package device 100E according to a sixth embodiment of the present invention, wherein those parts corresponding to the parts described previously are designated by the same reference numerals and the description thereof will be omitted.

Referring to the drawings, the SAW-filter package device 100E of the present embodiment has a construction similar to that of the first embodiment, except that the SAW-filter body 101 is mounted on a bottom plate 231 of a package body 230 in a face-up state. Thereby, the electrical interconnection between the SAW-filter body 101 and the package body 230 is achieved by a wire bonding process.

It should be noted that the package body 230 has a rectangular shape and includes the bottom plate 231 and a frame member 232 having a corresponding rectangular shape. As represented in FIGS. 29A and 29C, the frame member 232 carries a pair of stepped regions 233 and 234 at inner sides thereof so as to face each other, wherein the stepped region 233 has a depressed top surface as compared with the top surface of the frame member 232 and carries thereon a ground pad 235, an input pad 236 and a ground pad 237. Similarly, the stepped region 234 carries thereon a ground pad 238, an output pad 239 and a ground pad 240.

As represented in FIG. 29B, the bottom plate 231 carries thereon a first ground pattern 241 and a second ground pattern 242 in a mutually separated state. The bottom plate 231 further carries thereon an input pattern 243 and an output pattern 244. The package body 230 is covered by a conductive cap member 230c, and the conductive cap member 230c is connected electrically to the ground pattern 242 via a conductive line 232a formed in the frame member 232, similarly to the construction of FIG. 10. Alternatively, the conductive cap member 230c may be connected to both the ground pad 241 and 242 via respective resistances, more precisely impedance, R represented by a broken line, similarly to the embodiment of FIG. 23. Further, the ground pad 241 and the ground pad 242 may be connected electrically to each other via a resistance R', more precisely impedance, similarly to the embodiment of FIG. 26.

Further, the bottom plate 231 carries, on a bottom surface thereof, ground foot patterns 245–248 at respective corners as represented in FIG. 29D. Further, an input foot pattern 249 and an output foot pattern 250 are formed on the bottom surface of the bottom plate 231 so as to oppose with each other. More specifically, the input foot pattern 249 and the output foot pattern 250 are formed at respective central part of the inner edges of the frame member 232 that oppose with each other.

The input pad 236 is connected to the input pattern 243 via a via-hole formed in the frame member 232, while the input pattern 243 and the input foot pattern 244 are connected with each other via a via-hole formed in the bottom plate 231. Further, the output pad 239 is connected to the output pattern 244 and the output foot pattern 250 via a via-hole in the frame member 232, and the output pattern 244 and the output foot pattern 250 are connected through a via-hole formed in the bottom plate 231.

Further, as represented in FIG. 29C, the ground pads 235 and 237 are connected to the first ground pattern 241 via a via-hole 251 formed in the frame member 237, and the first ground pattern 241 is connected to the ground foot patterns 246 and 248 via a via-hole 252 formed in the bottom plate 231. The ground pad 238 and 240 are connected to the second ground pattern 242 via a via-hole 253 formed in the frame member 232, and the second ground pattern 242 is connected to the ground foot patterns 245 and 247 via a via-hole 254 formed in the bottom plate 231.

Further, there are provided bonding wires between the terminals of the SAW-filter body 101 and the corresponding pads 235–240. Particularly, there is provided a wire 260 connecting the ground terminal 47A of the output-side interdigital electrode pair and the ground pad 235. Further, a wire 261 is provided so as to connect the ground terminal 21A of the input-side interdigital electrode pair and the ground pad 240.

Thus, the SAW-filter package device 100E has a construction in which the ground terminal 21A for the input-side interdigital electrode pair and the ground terminal 47A for the output-side interdigital electrode pair are disconnected.

Figure 30:
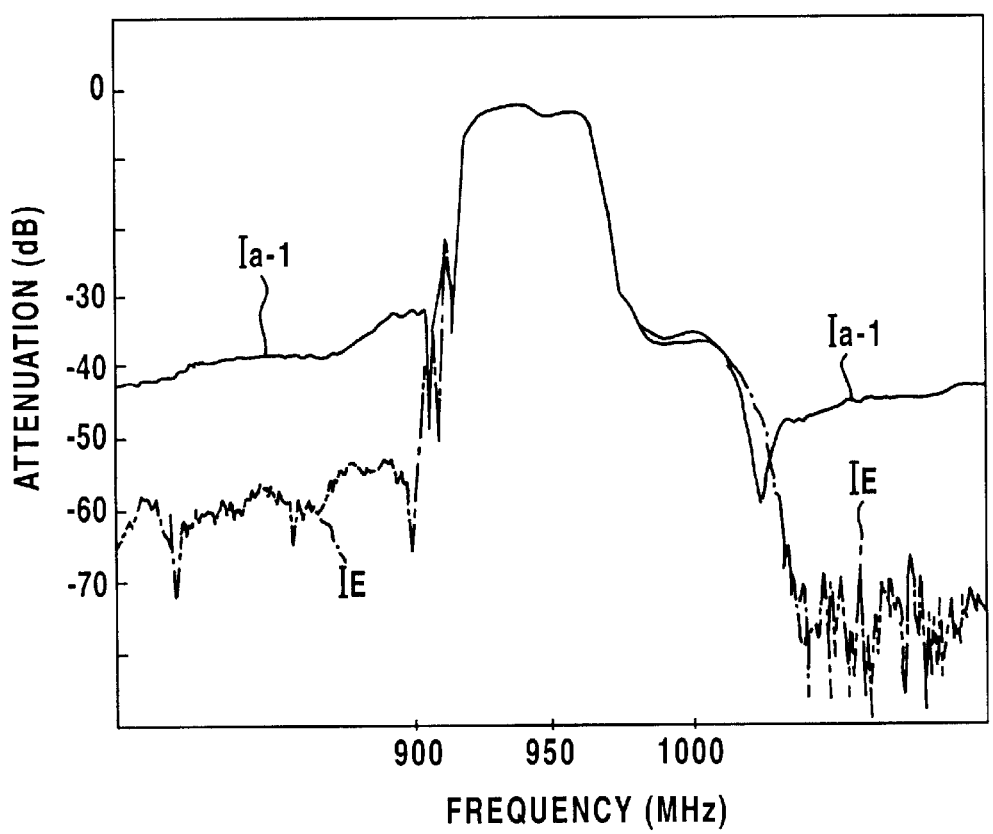
FIG. 30 is a diagram showing the frequency characteristic of the SAW-filter package device of the sixth embodiment.

FIG. 30 shows the frequency characteristic of the SAW-filter package device 100E of the present embodiment in the state that the SAW-filter package device 100E is mounted on a printed circuit board.

Referring to FIG. 30, the curve $Ia_{-1}$ represents the result in which the ground pattern 241 and the ground pattern 242 are connected commonly while the curve IE represents the case in which the SAW-filter package device 100E is mounted on the printed circuit board in the state that the ground patterns 241 and 242 are separated.

As can be seen clearly from FIG. 30, the construction of the present embodiment suppresses the spurious frequency components outside the pass-band efficiently, with a substantially improved degree of suppression.

SEVENTH EMBODIMENT

FIGS. 31A–31D show the construction of a ladder-type SAW-filter package device 100F according to a seventh embodiment of the present invention.

Figure 32A:
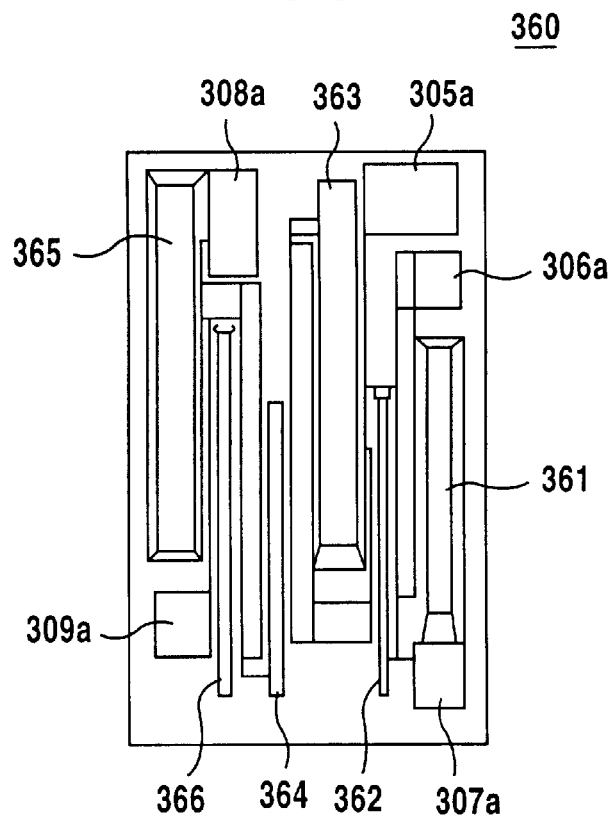
FIGS. 32A and 32B are diagrams showing the construction of a SAW-filter body used in the SAW-filter package device of the seventh embodiment.
Figure 32B:
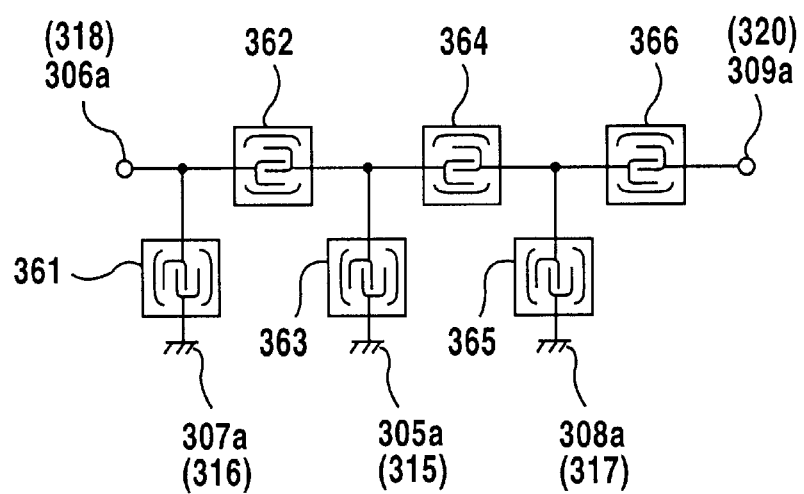

Referring to the drawings, the SAW-filter package device 100F includes a SAW-filter body 360 of FIGS. 32A and 32B and a package body 300 wherein the SAW-filter body 360 is mounted on a bottom plate 301 of the package body 300 in a face-up state. Thereby, a wire bonding process is used for interconnecting the SAW-filter body 360 to the package main body. As can be seen from the equivalent circuit diagram of FIG. 32B, the SAW-filter body 360 has a ladder-type construction.

It should be noted that the rectangular package body 300 includes, in addition to the bottom plate 301, a rectangular frame member 302, wherein the frame member 302 includes a depressed, stepped parts 303 and 304 at mutually opposing inner edges thereof, wherein the stepped part 303 carries thereon a ground pad 305, an input pad 306 and a ground pad 307. On the other hand, the stepped part 304 carries thereon a ground pad 308, an output pad 309 and a ground pad 300.

Figure 31A:
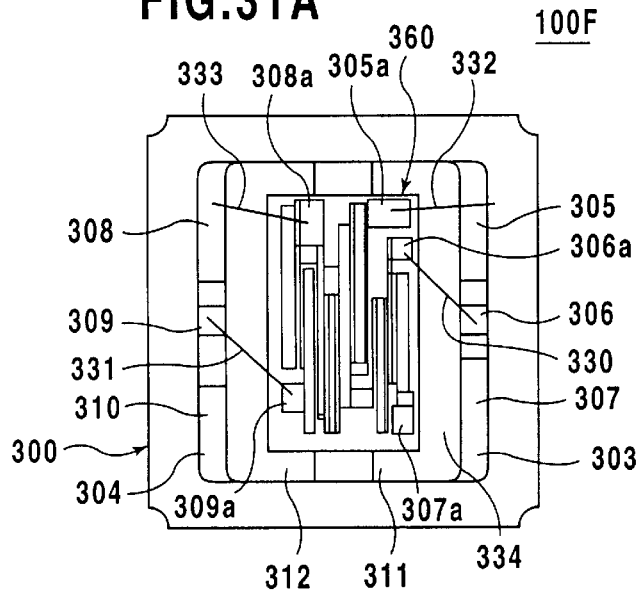
FIGS. 31A–31D are diagrams showing the construction of a SAW-filter package device according to a seventh embodiment of the present invention.
Figure 31B:
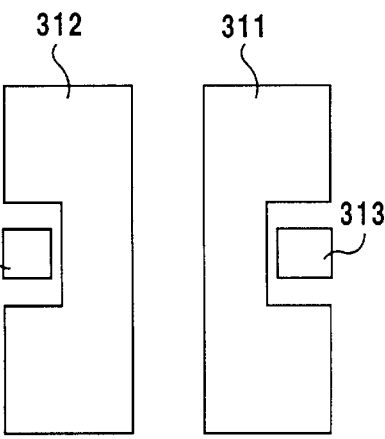
Figure 31C:
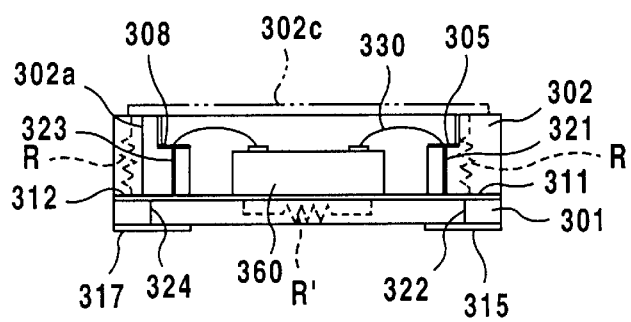
Figure 31D:
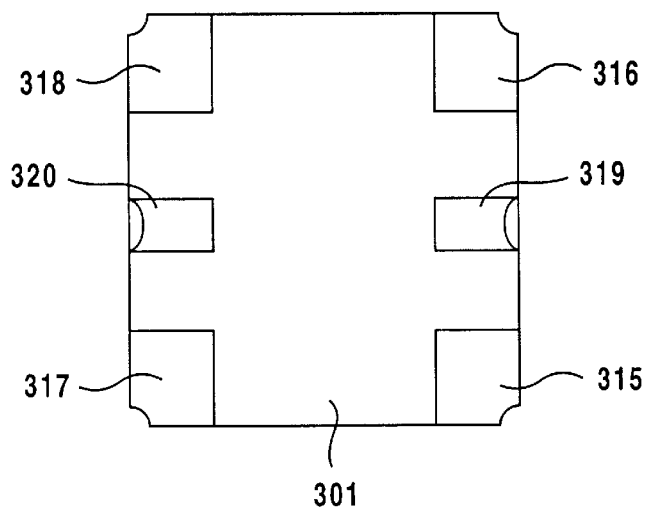

As represented in FIG. 31C, the bottom plate 301 carries, on a top surface thereof, a first ground pattern 311 and a second ground pattern 312 in a mutually separated state. Further, an input pattern 313 and an output pattern 314 are formed on the top surface of the bottom plate 301. The frame member 302 carries thereon a conductive cap member 302c such that the conductive cap member 302c closes the space of the package body 300 in which the SAW-filter body 360 is accommodated.

The conductive cap member 302c is connected electrically to the ground pattern 312 via a conductive line 302a formed in the frame member 302, similarly to the construction of FIG. 10. Alternatively, the conductive cap member 302c may be connected to both the ground patterns 311 and 312 via respective resistances R, more precisely impedance, represented by a broken line, similarly to the embodiment of FIG. 23. Further, the ground pattern 311 and the ground pattern 312 may be connected electrically to each other via a resistance R', more precisely impedance, similarly to the embodiment of FIG. 26.

The bottom plate 301 further carries, on a bottom surface thereof, ground foot patterns 315–318 at respective four corners and further an input foot pattern 319 and an output foot pattern 320 at respective central parts of opposing edges of the bottom plate 301. Thereby, the input pad 306 and the input pattern 313 are connected by a via-hole inside the frame member 302, while the input pattern 313 is connected to the input foot pattern 319 via a via-hole formed in the bottom plate 301. The output pad 309 and the output pattern 314 are connected via a via-hole formed inside the frame member 302, while the output pattern 314 is connected to the output foot pattern 320 via a via-hole formed in the bottom plate 301.

Further, as represented in FIG. 31C, the ground pads 305 and 307 are connected to the first ground pattern 311 via a via-hole 321 formed in the frame member 302, while the first ground pattern 311 is connected to the ground foot patterns 315 and 316 via a via-hole 322 formed in the bottom plate 301. Similarly, the ground pads 308 and 310 are connected to the second ground pattern 312 via a via-hole 312 formed in the frame member 302, while the second ground pattern 312 is connected to the ground foot patterns 317 and 318 via a via-hole 324 formed in the bottom plate 301.

As represented in FIGS. 32A and 32B, the SAW-filter body 360 includes SAW resonators 362, 364 and 366, each carrying reflectors at both sides thereof, in a series connection, and SAW resonators 361, 363 and 365 of the same construction are connected in parallel. Thereby, there is formed a ladder-type SAW-filter in the SAW-filter body 360. The SAW-filter body 360 further includes an input terminal 306a, an output terminal 309a, and ground terminals 305a, 307a and 308a.

In the construction of the SAW package 100F of FIG. 31A, it should be noted that there are provided bonding wires each connecting a terminal of the SAW-filter body 360 to a corresponding pad, which may be any of the pads 305–310, formed on the package body 300. Thereby, the wire 330 connects the input terminal 306a to the input pad 306, the wire 331 connects the output terminal 309a to the output terminal 309, the wire 332 connects the ground terminal 305a to the ground pad 305, the wire 333 connects the ground terminal 308a to the ground pad 308, and the wire 334 connects the ground terminal 307a to the ground pad 307.

In the ladder-type SAW-filter package device 100F of the present embodiment, it should be noted that the ground foot pattern 316 near the input foot pattern 319 is separated from the ground foot pattern 317 near the output foot pattern 320. Associated therewith, the ground terminal 307a near the input terminal 306a is separated from the ground terminal 308a near the output terminal 309a.

Figure 33A:
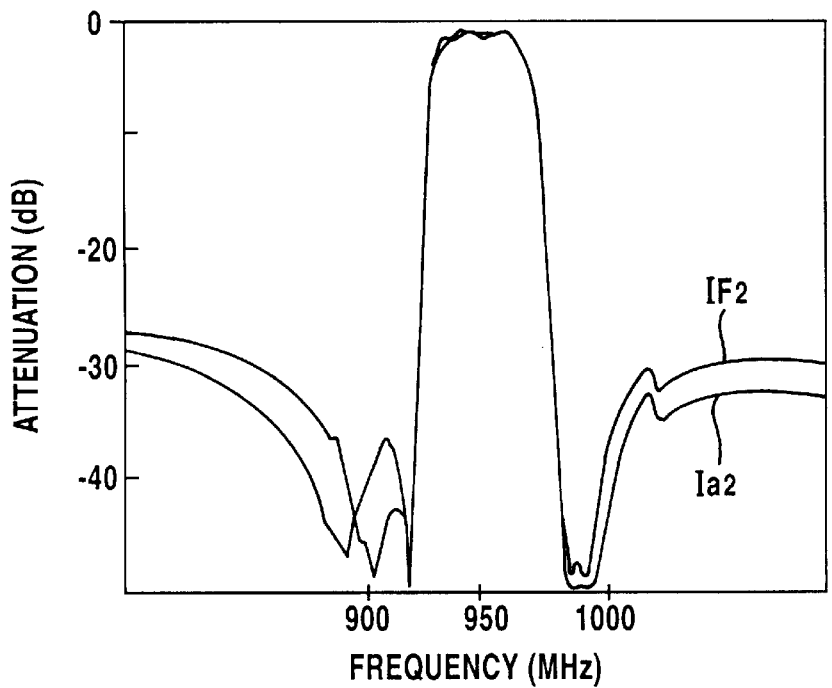
FIGS. 33A and 33B are diagrams showing the frequency characteristic of the SAW-filter package device of the seventh embodiment.
Figure 33B:
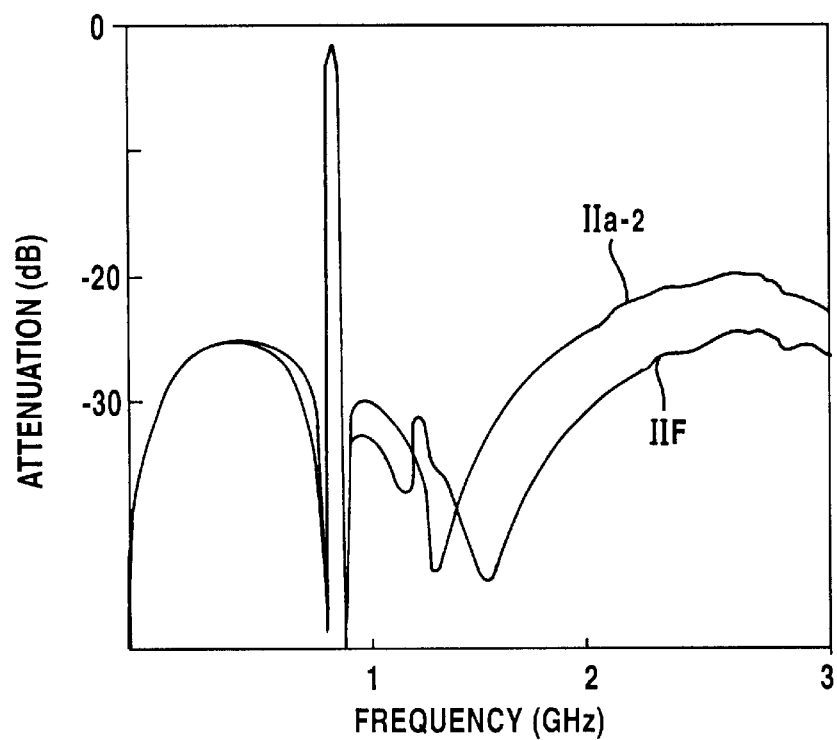

FIGS. 33A and 33B show the frequency characteristic of the SAW-filter package device 100F in the state that the SAW-filter package device 100F is mounted on a printed circuit board, wherein FIG. 33A shows the frequency characteristic near the pass-band in an enlarged scale in the frequency axis, while FIG. 33B shows the same frequency characteristic over an increased frequency range.

Referring to FIG. 33A, the frequency characteristic represented by the curve IF represents the frequency characteristic of the SAW-filter package device 100F, while the curve $I_{a-2}$ represents the frequency characteristic in which the ground terminals 307a and 308a are interconnected in the SAW-filter package device 100F. In FIG. 33B, the curve IIF represents the frequency characteristic corresponding to the frequency characteristic of the curve IF of FIG. 33A, while the curve $IIa_{-2}$ represents the frequency characteristic corresponding to the frequency characteristic of the curve $Ia_{-2}$ of FIG. 33A.

As can be seen in FIG. 33B, the construction of the SAW-filter package device 100F of the present embodiment is particularly effective for suppressing the very-high frequency spurious components of 1.5–3 GHz or higher.

It should be noted that the wire bonding process used in the SAW-filter package device 100F is not essential and one may use a flip-chip process for mounting the SAW-filter body 360 on the package body 300.

Further, the concept of the present invention of providing separate ground interconnection systems described heretofore according to various embodiments is applicable to various SAW-filters.

Particularly, the construction of FIG. 10 for the SAW-filter device 100 is applicable also to a ladder-type SAW-filter device such as the SAW-filter device 360 having an equivalent circuit diagram of FIG. 32B or to any of the SAW-filter devices 100A–100F explained with reference to the second through seventh embodiments of the present invention, with substantially the same improvement in the frequency characteristic. Similarly, the construction of FIG. 23 or FIG. 26 is applicable also to the ladder-type SAW filter device 360 or to any of the SAW-filter devices 100–100F explained with reference to the first through seventh embodiments of the present invention, with substantially the same frequency characteristic.

Thus, the present invention covers such various combinations of the embodiments described heretofore. As such combinations are obvious in view of the description made heretofore, further description thereof will be omitted.

Further, the present invention is not limited to the embodiments described heretofore, but various variations and modifications may be made without departing from the scope of the invention.

What is claimed is:

1. A SAW-filter device, comprising:

a piezoelectric substrate;

a double-mode SAW-filter circuit formed on said piezoelectric substrate; said double-mode SAW-filter circuit provided on said piezoelectric substrate;

a package body including therein a space, said package body accommodating said piezoelectric substrate in said space together with said double-mode SAW-filter circuit, said package body carrying an input and an output pad, said package body further carrying a plurality of ground pads separated from each other, said plurality of ground pads including a first ground pad and a second ground pad, said piezoelectric substrate being mounted upon said package body in a face-down state; and a conductor cap member provided on said package body so as to close said space, said cap member being electrically connected to one of said first and second ground pads.

2. A SAW-filter device as claimed in claim 1, wherein said SAW-filter circuit includes a first interdigital electrode pair formed on said piezoelectric substrate, said first interdigital electrode pair including a first interdigital electrode and a second interdigital electrode, said first interdigital electrode being connected to an input terminal;

a second interdigital electrode pair formed on said piezoelectric substrate, said second interdigital electrode pair including a third interdigital electrode and a fourth interdigital electrode, said third interdigital electrode being connected to an output terminal;

said piezoelectric substrate being mounted on said package body such that said input terminal is connected to said input pad, said output terminal is connected to said output pad, said second interdigital electrode is connected to said first ground pad and such that said fourth interdigital electrode is connected to said second ground pad.

3. A SAW-filter device as claimed in claim 2, wherein said first and second ground pads are electrically connected with each other via an impedance.

4. A SAW-filer device as claimed in claim 3, wherein said impedance is formed in said package body.

5. A SAW-filter device as claimed in claim 2, wherein said first interdigital electrode pair and said second interdigital electrode pair form together a cascaded SAW filter circuit including a first SAW filter element and a second SAW filter element cascaded to said first SAW filter element, said first SAW filter element including said first interdigital electrode pair as an input interdigital electrode pair, said second SAW filter element including said second interdigital electrode pair as an output interdigital electrode pair.

6. A SAW-filter device as claimed in claim 2, wherein said package body includes a bottom plate and a frame member defining together said space, said bottom plate carrying, on a top surface thereof, said first ground pad, said second ground pad, said input pad, and said output pad, wherein said bottom plate further carries, on a bottom surface thereof, a ground foot pattern, an input foot pattern, an output foot pattern, and an additional foot pattern.

7. A SAW-filter device as claimed in claim 6, wherein said ground foot pattern is connected to said first ground pad, said additional foot pattern is connected to said second ground pad, said input foot pattern is connected to said input pad, and said output foot pattern is connected to said output pad, said additional foot pattern being adapted for connection to a ground pattern formed on a printed circuit board.

8. A SAW-filter device as claimed in claim 6, wherein said ground foot pattern is connected to said first ground pad, said input foot pattern is connected to said input pad, said output foot pattern is connected to said output pad, and said additional foot pattern is connected to said second ground pad, said output foot pattern and additional foot pattern being adapted respectively for connection to a first output pattern and a second output pattern formed on a printed circuit board.

9. A SAW-filter device as claimed in claim 1, wherein said SAW circuit comprises a first SAW filter circuit and a second SAW filter circuit, said first SAW filter circuit including: a first interdigital electrode pair formed on said piezoelectric substrate, said first interdigital electrode pair including a first interdigital electrode and a second interdigital electrode, said first interdigital electrode being connected to an input terminal; and a second interdigital electrode pair formed on said piezoelectric substrate, said second interdigital electrode pair including a third interdigital electrode and a fourth interdigital electrode, said third interdigital electrode being connected to a first output terminal;

said second SAW filter circuit including: a third interdigital electrode pair formed on said piezoelectric substrate, said third interdigital electrode pair including a fifth interdigital electrode and a sixth interdigital electrode, said fifth interdigital electrode being connected to said input terminal commonly with said first interdigital electrode; a fourth interdigital electrode pair formed on said piezoelectric substrate, said fourth interdigital electrode pair including a seventh interdigital electrode and an eighth interdigital electrode, said seventh interdigital electrode being connected to a second output terminal.

10. A SAW-filter device as claimed in claim 1, wherein said piezoelectric substrate has a plurality of solder bumps connecting said terminals on said piezoelectric substrate to corresponding pads on said package body.

11. A SAW-filter device, comprising:

a piezoelectric substrate;

a double-mode SAW-filter circuit formed on said piezoelectric substrate, said double-mode SAW-filter circuit including a plurality of interdigital electrode pairs and outermost reflection electrodes provided on said piezoelectric substrate;

a package body including therein a space, said package body accommodating said piezoelectric substrate in said space, said package body carrying an input pad and an output pad, said package body further carrying a first ground pad and a second ground pad separated from said first ground pad, said piezoelectric substrate being mounted upon said package body in a face-down state; and a conductor cap member provided on said package body so as to close said space, said cap member being electrically connected to each of said first and second ground pads via first and second impedances.

12. A SAW-filter device as claimed in claim 11, wherein said SAW-filter circuit comprises a first interdigital electrode pair formed on said piezoelectric substrate, said first interdigital electrode pair including a first interdigital electrode and a second interdigital electrode, said first interdigital electrode being connected to an input terminal;

a second interdigital electrode pair formed on said piezoelectric substrate, said second interdigital electrode pair including a third interdigital electrode and a fourth interdigital electrode, said third interdigital electrode being connected to an output terminal;

said piezoelectric substrate being mounted on said package body such that said input terminal is connected to said input pad, said output terminal is connected to said output pad, said second interdigital electrode is connected to said first ground pad and such that said fourth interdigital electrode is connected to said second ground pad.

13. A SAW-filter device as claimed in claim 12, wherein a first interdigital electrode pair and a second interdigital electrode pair form together a cascaded SAW filter circuit including a first SAW filter element and a second SAW filter element cascaded to said first SAW filter element, said first SAW filter element including said first interdigital electrode pair as an input interdigital electrode pair, said second SAW filter element including said second interdigital electrode pair as an output interdigital electrode pair.

14. A SAW-filer device as claimed in claim 11, wherein said first and second impedances are formed in said package body.

15. A SAW-filter device as claimed in claim 11, wherein said package body includes a bottom plate and a frame member defining together said space, said bottom plate carrying, on a top surface thereof, said first ground pad, said second ground pad, said input pad, and said output pad, wherein said bottom plate further carries, on a bottom surface thereof, a ground foot pattern, an input foot pattern, an output foot pattern, and an additional foot pattern.

16. A SAW-filter device as claimed in claim 15, wherein said ground foot pattern is connected to said first ground pad, said additional foot pattern is connected to said second ground pad, said input foot pattern is connected to said input pad, and said output foot pattern is connected to said output pad, said additional foot pattern adapted for connection to a ground pattern formed on a printed circuit board.

17. A SAW-filter device as claimed in claim 15, wherein said ground foot pattern is connected to said first ground pad, said input foot pattern is connected to said input pad, said output foot pattern is connected to said output pad, and said additional foot pattern is connected to said second ground pad, said output foot pattern and additional foot pattern being adapted respectively for connection to a first output pattern and a second output pattern formed a printed circuit board.

18. A SAW-filter device as claimed in claim 11, wherein said SAW circuit comprises a first SAW filter circuit and a second SAW filter circuit,
said first SAW filter circuit including: a first interdigital electrode pair formed on said piezoelectric substrate, said first interdigital electrode pair including a first interdigital electrode and a second interdigital electrode, said first interdigital electrode being connected to an input terminal; and a second interdigital electrode pair formed on said piezoelectric substrate, said second interdigital electrode pair including a third interdigital electrode and a fourth interdigital electrode, said third interdigital electrode being connected to a first output terminal;
said second SAW filter circuit including: a third interdigital electrode pair formed on said piezoelectric substrate, said third interdigital electrode pair including a fifth interdigital electrode and a sixth interdigital electrode, said fifth interdigital electrode being connected to said input terminal commonly with said first interdigital electrode; a fourth interdigital electrode pair formed on said piezoelectric substrate, said fourth interdigital electrode pair including a seventh interdigital electrode and an eighth interdigital electrode, said seventh interdigital electrode being connected to a second output terminal.

19. A SAW-filter device as claimed in claim 11, wherein said piezoelectric substrate has a plurality of solder bumps connecting said terminals on said piezoelectric substrate to corresponding pads on said package body.

20. A SAW-filter device, comprising:
a piezoelectric substrate;
a double-mode SAW-filter circuit formed on said piezoelectric substrate, said double-mode SAW-filter circuit including a plurality of interdigital electrode pairs and outermost reflection electrodes provided on said piezoelectric substrate;
a package body including therein a space, said package body accommodating said piezoelectric substrate in said space, said package body carrying an input pad and an output pad, said package body further carrying a first ground pad and a second ground pad separated from said first ground pad, said piezoelectric substrate being mounted upon said package body in a face-down state; and
a conductor cap member provided on said package body so as to close said space,
said first and second ground pads being electrically connected to each other via an impedance.

21. A SAW-filer device as claimed in claim 20, wherein said impedance is formed in said package body.

22. A SAW-filter device as claimed in claim 20, wherein said SAW-filter circuit comprises a first interdigital electrode pair formed on said piezoelectric substrate, said first interdigital electrode pair including a first interdigital electrode and a second interdigital electrode, said first interdigital electrode being connected to an input terminal;
a second interdigital electrode pair formed on said piezoelectric substrate, said second interdigital electrode pair including a third interdigital electrode and a fourth interdigital electrode, said third interdigital electrode being connected to an output terminal;
said piezoelectric substrate being mounted on said package body such that said input terminal is connected to said input pad, said output terminal is connected to said output pad, said second interdigital electrode is connected to said first ground pad and such that said fourth interdigital electrode is connected to said second ground pad.

23. A SAW-filter device as claimed in claim 22, wherein said first interdigital electrode pair and said second interdigital electrode pair form together a cascaded SAW filter circuit including a first SAW filter element and a second SAW filter element cascaded to said first SAW filter element, said first SAW filter element including said first interdigital electrode pair as an input interdigital electrode pair, said second SAW filter element including said second interdigital electrode pair as an output interdigital electrode pair.

24. A SAW-filter device as claimed in claim 22, wherein said package body includes a bottom plate and a frame member defining together said space, said bottom plate carrying, on a top surface thereof, said first ground pad, said second ground pad, said input pad, and said output pad, wherein said bottom plate further carries, on a bottom surface thereof, a ground foot pattern, an input foot pattern, an output foot pattern, and an additional foot pattern.

25. A SAW-filter device as claimed in claim 24, wherein said ground foot pattern is connected to said first ground pad, said additional foot pattern is connected to said second ground pad, said input foot pattern is connected to said input pad, and said output foot pattern is connected to said output pad, said additional foot pattern being adapted for connection to a ground pattern formed on a printed circuit board.

26. A SAW-filter device as claimed in claim 24, wherein said ground foot pattern is connected to said first ground pad, said input foot pattern is connected to said input pad, said output foot pattern is connected to said output pad, and said additional foot pattern is connected to said second ground pad, said output foot pattern and additional foot pattern being adapted respectively for connection to a first output pattern and a second output pattern formed on a printed circuit board.

27. A SAW-filter device as claimed in claim 20, wherein said SAW circuit comprises a first SAW filter circuit and a second SAW filter circuit,
said first SAW filter circuit including: a first interdigital electrode pair formed on said piezoelectric substrate, said first interdigital electrode pair including a first interdigital electrode and a second interdigital electrode, said first interdigital electrode being connected to an input terminal; and a second interdigital electrode pair formed on said piezoelectric substrate, said second interdigital electrode pair including a third interdigital electrode and a fourth interdigital electrode, said third interdigital electrode being connected to a first output terminal;

said second SAW filter circuit including: a third interdigital electrode pair formed on said piezoelectric substrate, said third interdigital electrode pair including a fifth interdigital electrode and a sixth interdigital electrode, said fifth interdigital electrode being connected to said input terminal commonly with said first interdigital electrode; a fourth interdigital electrode pair formed on said piezoelectric substrate, said fourth interdigital electrode pair including a seventh interdigital electrode and an eighth interdigital electrode, said seventh interdigital electrode being connected to a second output terminal.

28. A SAW-filter device as claimed in claim 20, wherein said piezoelectric substrate has a plurality of solder bumps connecting said terminals on said piezoelectric substrate to corresponding pads on said package body.

* * * * *